(12) United States Patent
Layh et al.

(10) Patent No.: US 8,724,086 B2
(45) Date of Patent: May 13, 2014

(54) MICROLITHOGRAPHIC PROJECTION EXPOSURE APPARATUS HAVING A MULTI-MIRROR ARRAY WITH TEMPORAL STABILISATION

(75) Inventors: Michael Layh, Aalen (DE); Markus Deguenther, Aalen (DE); Michael Patra, Oberkochen (DE); Johannes Wangler, Koenigsbronn (DE); Manfred Maul, Aalen (DE); Damian Fiolka, Oberkochen (DE); Gundula Weiss, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 726 days.

(21) Appl. No.: 12/818,844

(22) Filed: Jun. 18, 2010

(65) Prior Publication Data
US 2010/0283985 A1 Nov. 11, 2010

Related U.S. Application Data

(63) Continuation of application No. PCT/EP2008/010801, filed on Dec. 18, 2008.

(60) Provisional application No. 61/015,918, filed on Dec. 21, 2007.

(30) Foreign Application Priority Data

Feb. 7, 2008 (DE) .......................... 10 2008 008 019

(51) Int. Cl.
*G03B 27/54* (2006.01)

(52) U.S. Cl.
USPC .......................................................... 355/67

(58) Field of Classification Search
USPC .................................................... 355/67, 53
See application file for complete search history.

(56) References Cited

U.S. PATENT DOCUMENTS 5,016,149 A 5/1991 Tanaka et al.
6,069,739 A * 5/2000 Borodovsky et al. ......... 359/577
(Continued)

FOREIGN PATENT DOCUMENTS

EP 1 865 359 12/2007
JP 11-003849 1/1999
(Continued)

OTHER PUBLICATIONS

International Search Report for the corresponding PCT Application No. PCT/EP2008/010801, dated Apr. 1, 2009.
(Continued)

*Primary Examiner* — Toan Ton
*Assistant Examiner* — Chia-how Michael Liu
(74) *Attorney, Agent, or Firm* — Fish & Richardson P.C.

(57) ABSTRACT

A projection exposure apparatus for microlithography comprises illumination optics for illuminating object field points of an object field in an object plane is disclosed. The illumination optics have, for each object field point of the object field, an exit pupil associated with the object point, where $\sin(\gamma)$ is a greatest marginal angle value of the exit pupil. The illumination optics include a multi-mirror array that includes a plurality of mirrors to adjust an intensity distribution in exit pupils associated to the object field points. The illumination optics further contain at least one optical system to temporally stabilize the illumination of the multi-mirror array so that, for each object field point, the intensity distribution in the associated exit pupil deviates from a second adjusted intensity distribution in the associated exit pupil by less than 0.1 in at least one of an inner σ or an outer σ.

24 Claims, 14 Drawing Sheets

(56) References Cited

U.S. PATENT DOCUMENTS

| | | | |
|---|---|---|---|
| 6,285,443 | B1 | 9/2001 | Wangler et al. |
| 6,563,566 | B2 | 5/2003 | Rosenbluth et al. |
| 6,819,490 | B2 * | 11/2004 | Sandstrom et al. ............ 359/566 |
| 2001/0030739 | A1 | 10/2001 | Hase et al. |
| 2003/0071204 | A1 | 4/2003 | Sandstrom et al. |
| 2004/0265707 | A1 | 12/2004 | Socha |
| 2007/0165202 | A1 | 7/2007 | Koehler et al. |
| 2007/0285638 | A1 * | 12/2007 | Ravensbergen et al. ........ 355/53 |

FOREIGN PATENT DOCUMENTS

| | | |
|---|---|---|
| WO | WO 2005/026843 | 3/2005 |
| WO | WO 2006/013814 | 2/2006 |

OTHER PUBLICATIONS

European Office Action for corresponding EP Appl No. 08 865 896.8-1226, dated Feb. 16, 2011.

* cited by examiner

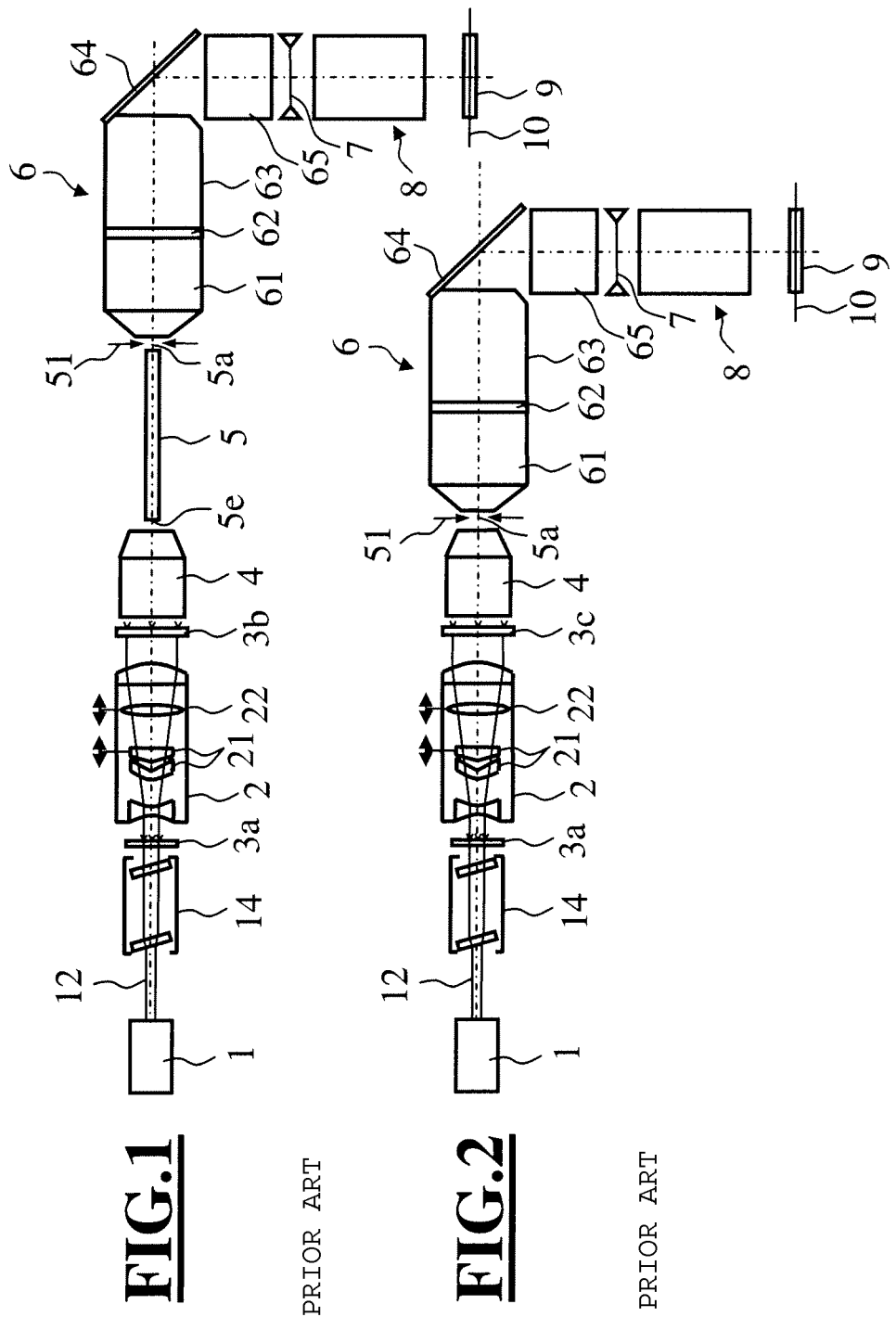

MICROLITHOGRAPHIC PROJECTION EXPOSURE APPARATUS HAVING A MULTI-MIRROR ARRAY WITH TEMPORAL STABILISATION

CROSS-REFERENCE TO RELATED APPLICATIONS

This application is a continuation of, and claims benefit under 35 USC 120 to, international application PCT/EP2008/010801, filed Dec. 18, 2008, which claims benefit of German Application No. 10 2008 008 019.5, filed Feb. 7, 2008 and U.S. Ser. No. 61/015,918, filed Dec. 21, 2007. International application PCT/EP2008/010801 is hereby incorporated by reference in its entirety.

FIELD

The disclosure relates to microlithographic exposure apparatus that image a mask onto a light sensitive surface, including such apparatus that include illumination optics that contain an array of mirrors.

BACKGROUND

Microlithographic projection exposure apparatus often include illumination optics for producing an intensity distribution in an exit pupil associated with object field points in an object field which is illuminated by illumination optics. Such apparatus are known, for example, from U.S. Pat. No. 6,285,443 B1. The structuring (i.e. producing a desired intensity distribution) of exit pupils results from structuring an intensity distribution in angle space, which is produced by a diffractive optical element (DOE) in a plane which is Fourier related by Fourier optics to a subsequent pupil plane. In the exit pupil the intensity distribution is described as a function of pupil coordinates which correspond to angles in the plane of the DOE. Variable zoom objectives and/or axicon systems, which are arranged between the DOE and the pupil plane, may be used to selectively vary the angle distribution produced by the DOE. It is thereby possible, for example, to adjust the coherence of the illumination, for example the outer and/or inner σ of a setting, with σ being the coherence parameter which will be described in more detail below. These adjustable elements make it possible to obtain a more complex structuring of exit pupils. The zoom objective and/or the axicon system can ensure a radially symmetric or axisymmetric redistribution of light about the optical axis of the pupil plane as a symmetry axis. Without restriction of generality, symmetry of the axicon is assumed with respect to the optical axis.

For the coherence parameters indicated above, the outer σ is a measure of the fill factor of light in the exit pupil. Conversely, the inner σ is a measure of the fill factor of central obscuration or shadowing inside the light-filled region in the exit pupil that is described by the outer σ. At least one further set of Fourier optics transforms the distribution as a function of the pupil position in the pupil plane into an angle distribution in a subsequent object plane, so that the exit pupils of the object field points of the object field in the object plane of the illumination optics are structured.

A restricting factor in these projection exposure apparatus can be that structuring produced by a DOE can be modified only to a small extent, essentially radially symmetrically or axisymmetrically with respect to the optical axis, by adjusting lenses of the zoom objective or elements of the axicon system. If a completely different structure of the exit pupil is desired, it is desirable to change the DOE. In practice, the time taken to provide a suitable DOE for the desired pupil structuring may be several days or even weeks. Such projection exposure apparatus are therefore only limitedly suitable for fulfilling the customer's desired rapid change. For example, it is not possible to a change between very different structurings of the exit pupils within fractions of a second.

Projection exposure apparatus for microlithography, having illumination optics for rapidly changing the structuring of exit pupils via multi-mirror arrays (MMA) are known, for example, from WO 2005/026843 A2.

Methods for calculating optimal structurings of exit pupils of illumination optics of a projection exposure apparatus as a function of mask structures to be imaged on the reticle are known, for example, from U.S. Pat. No. 6,563,566 B2 and US 2004/0265707 A1.

SUMMARY

In some embodiments, the disclosure provides a projection exposure apparatus having a multi-mirror array (MMA) for rapidly and reproducibly changing the structuring of exit pupils of object field points of illumination optics of a projection exposure apparatus.

In certain embodiments, a projection exposure apparatus for microlithography contains at least one optical system for temporally stabilising illumination of the multi-mirror array (MMA) so that, for each object field point, the intensity distribution in the associated exit pupil deviates from a desired intensity distribution in the associated exit pupil as follows:

in the case of a centroid angle value sin(β), by less than two percent expressed in terms of the greatest marginal angle value sin(γ) of the associated exit pupil and/or;
in the case of ellipticity, by less than two percent; and/or
in the case of a pole balance, by less than two percent.

The inventors have discovered that the DOE in conventional projection exposure apparatus, as described for example in U.S. Pat. No. 6,285,443 B1, can lead to strong light mixing in the exit pupils. Here, strong light mixing means that the intensity of a region in the exit pupil is formed by the superposition of a multiplicity of illumination rays, which come from essentially all positions or field points of the DOE. In such systems the temporal and/or spatial fluctuations of the light source, for example spatial laser jitter, are therefore balanced out by the strong light mixing of the DOE. During the exposure process, this gives approximately temporally stabilised structuring in the exit pupils, which fluctuates only to a small extent relative to time-averaged structuring. For conventional projection exposure apparatus with DOEs, it is now possible in a wide variety of ways to make such time-averaged structuring in the exit pupils approximate structuring desired for the exposure process. Estimates, which are applicable for a large number of systems, have revealed that about 80,000 or more mirrors of a multi-mirror array (MMA) for a projection exposure apparatus are useful to replicate the light mixing property of a DOE of a conventional projection exposure apparatus. Such multi-mirror arrays (MMA) with so large a number of mirrors for projection exposure apparatus, to generate strong light mixing, are currently not believed to be technologically achievable.

According to the disclosure, it has been discovered that for projection exposure apparatus having fewer than 80,000 mirrors, temporal stabilisation of the illumination of a multi-mirror array (MMA) gives similarly good or even better time-averaged structurings of the exit pupils. Structuring of exit pupils of the projection exposure apparatus, calculated as optimal and desired by the user of the projection exposure apparatus, is therefore reproducible with high accuracy by the projection exposure apparatus during the exposure process. Fluctuations in the structuring of exit pupils with only very small tolerable deviations relative to the desired structuring are therefore achievable. This means that systems disclosed herein can advantageously allow the light mixing property of a DOE in the pupil to be replicated for temporally stabilising desired structuring of an exit pupil. The exit pupil is therefore advantageously decoupled from the temporal and/or spatial fluctuations of the light source, for example laser jitter of an excimer laser, by temporally stabilising the illumination in a position or field plane of the illumination optics, which contains, for example, the MMA with fewer than 80,000 mirrors.

The structuring of an exit pupil is equivalent in meaning here to an intensity distribution in the exit pupil. In the specialist's terminology, setting is also referred to instead of structuring of an exit pupil.

The exit pupil of an object field point is defined in optics textbooks as the image of the aperture-limited stop, which results from imaging this stop through the optics following the stop in image space. Expressed another way, the exit pupil is the image of the aperture-limited stop as it appears with backward observation of the stop as seen from the object field point through the optics following the stop. If the aperture-limited stop lies at a distance from the subsequent optics shorter than the value of the focal length of the subsequent optics, then the exit pupil is a virtual image of the aperture-limited stop and precedes the object plane of the object field point in question in the light direction. But if the stop lies at a distance from the subsequent optics longer than the value of the focal length of these optics, then the exit pupil is a real image of the aperture-limited stop which may for example be captured or represented by a screen at the position of the exit pupil. In a telecentric system, the aperture-limited stop lies at a distance from the subsequent optics which corresponds to the focal length of the subsequent optics, so that the exit pupil is found both as a virtual image of the aperture-limited stop at infinity in the light direction before the object field plane of the object field point in question, and as a real image of the aperture-limited stop in the light direction at infinity after the object field plane of the object field point in question. This virtual or real image of the aperture-limited stop as the exit pupil of a telecentric system may readily be obtained by those illumination rays of the object field point which can just still pass through the aperture-limited stop (marginal rays) at the object field point being extended in a straight line backwards or in a straight line forwards to infinity. A position of an illumination ray in the virtual or real image of the aperture-limited stop as the exit pupil of an object field point in this case corresponds to the associated angle of the illumination ray in the object plane at the object field point. The correspondence is made here using the tangent of the angle of the illumination ray, which at the same time is the ratio of the distance of the position of the illumination ray in the exit pupil from the exit pupil centre to the exit pupil distance from the object field plane. Since this involves a one-to-one correspondence between distances of positions in the exit pupil relative to the centre of the exit pupil and the angle in the object field plane via the tangent function, an alternative definition of the exit pupil using the angles in the object field plane is to be taken as valid in the scope of this application in addition to the classical definition of the exit pupil in optics textbooks. The exit pupil of an object field point in the scope of this application is the angle range or angle space of the object field point in the object plane, which is limited by the aperture-limited stop of the illumination optics and within which the object field point can receive light from the illumination optics. This definition of the exit pupil in the scope of this application has the advantage that the angle range or angle space of the object field point in the object plane, within which the object field point can receive light from the illumination optics, is more readily accessible for technical measurement purposes than the virtual or real image of the aperture-limited stop at infinity.

As an alternative, instead of in the form of an angle range or an angle space in the object plane, the exit pupil may also be described as a Fourier transform thereof in the form of a pupil plane of so-called Fourier optics. Such Fourier optics could for example be part of a measuring instrument for analysing exit pupils, which is introduced into the object plane of the illumination optics. By the Fourier relation between the object and pupil planes of the Fourier optics, a height of a point of the pupil plane of the Fourier optics measured against the optical axis in the pupil plane is thereby associated with a sine of an illumination angle measured against the optical axis in the object plane.

The structuring of an exit pupil, or equivalently the intensity distribution in an exit pupil, may therefore be described either as an intensity distribution over the image plane of the virtual or real image of the aperture-limited stop, or as an intensity distribution over the surface in a pupil plane of Fourier optics, or as an intensity distribution over angle ranges or over the angle space in a position/image or field plane.

In general, illumination optics for a projection exposure apparatus for microlithography have a telecentric beam path in the object or reticle plane with less than 50 mrad deviation from the telecentricity condition. Such an approximation to a telecentric beam path in the reticle plane is advantageous for the tolerances with which the reticle is desirably positioned along the optical axis for optimal imaging. In perfect telecentric illumination optics with telecentricity values of 0 mrad, the virtual or real images of the aperture-limited stop as exit pupils of the illumination system lie at infinity, and the exit pupils of all field points therefore coincide with one another. The angle ranges of the object field points as exit pupils in the scope of this application, in which the object field points can receive light from the illumination optics, likewise coincide.

With a small telecentricity profile of less than 50 mrad over the object field in the object or reticle plane, the virtual or real images of the aperture-limited stop as exit pupils are mutually decentred at a very large distance from the illumination optics. Moreover, the angle ranges of the object field points as exit pupils in the scope of this application are mutually tilted in the object plane. For this reason, and for the reason that other imaging errors of the illumination optics may lead to further differences in the exit pupils of the object field points, a general exit pupil of illumination optics for a projection exposure apparatus will not be considered in the scope of this application, rather distinction will be made according to the individual exit pupils of the object field points and the respective intensity distribution in the individual exit pupils of the object field points. In the ideal case, as already mentioned, these exit pupils may also coincide.

In the pupil planes of Fourier optics or Fourier planes conjugated therewith, for example in the pupil planes inside illumination optics or in the pupil planes of measuring optics for analysing pupils, it is possible either to influence an intensity distribution in the relevant plane or measure it there. In this case, these planes need not necessarily be planes in the sense of the word "planar", rather they may also be curved in up to two spatial directions. It is likewise possible in the object/image or field planes, or Fourier planes conjugated therewith, either to influence an intensity distribution over the angles in the relevant plane or measure it there. Here again, the generalisation mentioned for the pupil planes applies to the term "plane".

As a measure of a deviation of a desired intensity distribution from an intensity distribution of an exit pupil of an object field point, produced in a projection exposure apparatus, inter alia it is feasible to use the difference of the centroid angle value $\sin(\beta)$ of the two intensity distributions relative to the greatest marginal angle value $\sin(\gamma)$ of the associated exit pupil. Angle values in the scope of this application are intended to mean the sine, $\sin(x)$, of the corresponding angle x. The marginal angle value is therefore intended to mean the sine of the angle at which a marginal point of the exit pupil is seen from the object field point with respect to the optical axis or an axis parallel thereto. With the alternative definition of the exit pupil as an angle range of an object field point, within which the object field point can receive light from the illumination optics, the marginal angle value is the sine of a marginal or limiting angle of the angle range which applies as an exit pupil here. The greatest marginal angle value $\sin(\gamma)$ is the greatest-magnitude angle value of all marginal angles of all marginal points of the exit pupil, or the greatest-magnitude angle value of all marginal angles of the angle range which applies as an exit pupil here. The centroid angle value $\sin(\beta)$ is the sine of the centroid angle $\beta$ of an intensity distribution in the exit pupil, and this in turn is the angle of the direction in which the centroid of the intensity distribution in the exit pupil is perceived from an object field point.

The direction, in which the centroid of the intensity distribution in the exit pupil is perceived, is often also referred to as the central ray direction. The centroid angle value, or the sine of the central ray angle, is at the same time the measure of the telecentricity of the exit pupil for a given intensity distribution.

In the case of telecentricity, distinction is often also made between geometrical and energetic telecentricity (see below). In the case of geometrical telecentricity, furthermore, distinction is made between the principal ray telecentricity (see below) and the geometrical telecentricity with uniform rotationally symmetric filling of the exit pupil. The latter is equivalent in meaning to the centroid angle value, or the sine of the central ray angle, in the case of uniform rotationally symmetric filling of the exit pupil with light up to a limiting angle value, which can vary between zero and the greatest marginal angle value.

With essentially uniform rotationally symmetric filling of the exit pupil with light, i.e. an essentially uniform rotationally symmetric intensity distribution in the exit pupil, so-called $\sigma$ settings or partially coherent settings are also referred to. In the specialist's literature, the outer $\sigma$ of a setting is intended to mean the ratio of the sine of that angle to the sine of the greatest marginal angle, at which the light-filled region in the exit pupil ends abruptly. With this definition of the outer $\sigma$ of a setting, however, the conditions in real illumination optics are neglected, such as the existence of imaging errors, ghost images and scattered light. An abrupt transition of bright and dark regions in the exit pupil can be produced only approximately by using stops in a pupil plane of the illumination optics, since the imaging errors, the ghost images and the scattered light can then for the most part be neglected. The use of stops in the pupil planes of the illumination optics to produce settings, however, can lead to light losses and therefore to a reduction in the throughput of substrates or wafers to be exposed. In the scope of this application, the definition of the outer $\sigma$ of a setting is to apply only for illumination optics for projection exposure apparatus which produce a desired setting via stops. For all other illumination optics, contrary to the textbook definition of the outer $\sigma$ of a setting as explained above, for the reasons explained above, the outer $\sigma$ is to be the ratio of the sine of that angle to the sine of the greatest marginal angle within which 90% of the total intensity of the exit pupil lies. For all other illumination optics, the following therefore applies:

$$\text{outer } \sigma = \text{angle value}(90\% \text{ intensity})/\sin(\gamma).$$

In general, owing to the imaging errors of the illumination optics, different values which may lie between zero and a few mrad are found for the telecentricity with different $\sigma$ settings and for the principal ray telecentricity for a given object field point.

The principal ray telecentricity of an object field point is intended to mean the angle of the principal ray relative to the optical axis or an axis parallel thereto at the position of the object field point. The principal ray is in this case that ray which comes from the geometrical centre of the exit pupil as seen from the object field point.

Likewise, different values are generally obtained for the telecentricity values with annular settings and for the principal ray telecentricity for a given object field point. An annular setting involves an intensity distribution in the exit pupil which has not only an outer $\sigma$ for delimitation of the light in the exit pupil, but also an inner $\sigma$. The inner $\sigma$ of a setting describes the extent of central shadowing or obscuration in the exit pupil. In the specialist's literature, the inner $\sigma$ of a setting is intended to mean the ratio of the sine of that angle to the sine of the greatest marginal angle, at which the central shadowing or obscuration in the exit pupil ends abruptly. For the same reasons as explained above in respect of the outer $\sigma$, this definition of the inner $\sigma$ of a setting is very suitable for illumination optics in which the settings are produced by stops in the pupil planes. For the inner $\sigma$ of a setting for all other illumination optics, contrary to this definition, in the scope of this application, the inner $\sigma$ of a setting is to be taken as the ratio of the sine of that angle to the sine of the greatest marginal angle within which 10% of the total intensity of the exit pupil lies. For all other illumination optics, the following therefore applies:

$$\text{inner } \sigma = \text{angle value}(10\% \text{ intensity})/\sin(\gamma).$$

The energetic telecentricity on the other hand results from different parts of the exit pupil having different intensity values, or from different parts of the exit pupil being differently distorted by the imaging errors of the illumination optics, or better expressed being distortedly imaged.

Since the telecentricity is not a unique quantity owing to the different ways of considering it, in the scope of this application the centroid angle value will be used as a unique comparative quantity, i.e. the sine of the centroid angle or of the central ray angle. This quantity includes both energetic and geometrical causes of the central ray angle of the intensity distribution in the exit pupils, and in the end also represents that quantity which describes the effect of the centroid angle or the central ray angle overall on the imaging process of the mask imaging.

A further measure of a deviation of a desired intensity distribution from an intensity distribution of an exit pupil of an object field point, produced in a projection exposure apparatus, is the difference in ellipticity between the desired intensity distribution and the achieved intensity distribution.

In order to calculate the ellipticity of an intensity distribution of an exit pupil, the latter is subdivided into four quadrants. Here, there are two conventional options for arranging the quadrants with respect to the coordinate system in the object field plane with an x direction and a y direction. In the first arrangement of the quadrants, the exit pupil is divided by one line in the x direction and one line in the y direction. This division is referred to as xy division.

In the second arrangement, the lines extend at 45° to the xy coordinate system. The latter division of the exit pupil is named HV division, since the quadrants lie in horizontal (H) and vertical (V) directions with respect to the object field.

An ellipticity of an intensity distribution in an exit pupil is now intended to mean the magnitude value, multiplied by one hundred percent, of the difference between the sum of the intensities in the two H quadrants of the exit pupil and the sum of the intensities in the two V quadrants of the exit pupil, normalised to the sum of the two sums. The ellipticity for an XY division of the exit pupil is defined similarly.

A further measure of a deviation of a desired intensity distribution from an intensity distribution of an exit pupil of an object field point, produced in a projection exposure apparatus, is the difference in the pole balance between the desired intensity distribution and the achieved intensity distribution. In order to calculate the pole balance of an intensity distribution of an exit pupil, according to the number of poles or regions with intensity in the exit pupil, the latter is correspondingly subdivided into equally large sections radially symmetrically about the optical axis. This means that for a dipole setting having two regions with intensity lying opposite one another in the exit pupil, the exit pupil is divided into two halves as sections. For a quadrupole setting having four regions with intensity in the exit pupil, the exit pupil is divided into four quadrants as sections. Similarly for n-pole settings having n regions with intensity in the exit pupil, the exit pupil is divided into n sections. A pole balance of an intensity distribution in an exit pupil is now intended to mean the value, multiplied by one hundred percent, of the difference between the maximum intensity of a section of the exit pupil and the minimum intensity of a section of the exit pupil, normalised to the sum of the intensities from the two sections.

Temporal and/or spatial fluctuations of a light source in the scope of this application are intended to mean inter alia temporal and/or spatial changes in the following properties of an illumination ray bundle output by the light source: position of the illumination ray bundle perpendicularly to the optical axis between the light source and the illumination optics, position of parts of the illumination ray bundle relative to the rest of the illumination ray bundle perpendicularly to the optical axis between the light source and the illumination optics, direction of the illumination ray bundle, direction of parts of the illumination ray bundle relative to the direction of the rest of the illumination ray bundle, intensity and polarisation of the illumination ray bundle, intensity and polarisation of parts of the illumination ray bundle relative to the intensity and polarisation of the rest of the illumination ray bundle, and any combination of the properties.

Light sources with wavelengths of between 365 nm and 3 nm may be envisaged as light sources for a projection exposure apparatus for microlithography, such as high-pressure mercury vapour lamps, lasers, for example excimer lasers, for example $ArF_2$, $KrF_2$ lasers or EUV light sources. In the case of excimer lasers as the light source with a typical wavelengths of 248 nm, 193 nm, 157 nm and 126 nm in the scope of this application, inter alia changes in the mode number and mode composition of the laser modes of the laser pulses of the light source are also to be understood as temporal and/or spatial fluctuations of the light source.

Temporally stabilised illumination of the multi-mirror array (MMA) in the scope of this application is intended to mean a spatial intensity distribution of the illumination ray bundle in the plane of the multi-mirror array (MMA), or on the multi-mirror array (MMA), which changes with time as a moving ensemble average (see below) or as a moving time average (see below) in its spatial distribution only by less than 25 percent, such as less than 10 percent, expressed in terms of the average or averaged spatial distribution of all ensemble averages or time averages. The moving ensemble average is in this case a moving average value over an ensemble of light pulses of a pulsating light source (see below). The moving time average is correspondingly a moving average value over a particular exposure time of a continuous light source (see below).

The integral intensity of the intensity distribution, or illumination, over the multi-mirror array (MMA) may in this case very well change very greatly as a function of time, for example from light pulse to light pulse, but not the spatial distribution of the illumination over the multi-mirror array (MMA) as a moving ensemble average or as a moving time average. Furthermore, the average or averaged integral intensity of the intensity distribution over the multi-mirror array (MMA) as a moving ensemble average or as a moving time average also desirably does not change greatly, since the dose of an image field point of the projection exposure apparatus would thereby change greatly, which as a rule is undesirable for the exposure.

A moving ensemble average is intended to mean the moving average value of a quantity over an ensemble of a number n of successively occurring light pulses. Here, moving means that the first light pulse of the ensemble of n successively occurring light pulses is an arbitrary light pulse of the light source, and therefore that the ensemble average moves in time with the first light pulse of the ensemble. The situation is similar with the moving time average over a particular exposure time of a continuous light source, where the moving average value of a quantity over a particular exposure time moves in time with the starting instant of the exposure time to be considered.

The number n of light pulses of the ensemble, or the particular exposure time, is determined according to how many light pulses or what exposure time is or are involved for the exposure of an image field point of the workpiece to be exposed. Depending on the projection exposure apparatus, ranging from projection exposure apparatus for so-called maskless lithography, through so-called scanners to so-called steppers, the ensemble may therefore amount to between one light pulse and several hundred light pulses, or corresponding exposure times.

Both the structuring of an exit pupil or the intensity distribution in an exit pupil, and the centroid angle value, the ellipticity, the pole balance, the outer and inner σ of an exit pupil of an object field point of a projection exposure apparatus are to be understood in the scope of this application inter alia as further moving ensemble average values or moving time average values. This is because only these moving ensemble average values or moving time average values of a quantity are relevant overall for the exposure of an image field point, since only this overall characterises or describes the illumination or imaging conditions prevailing during the exposure process with the light pulses of the ensemble or the exposure time.

In some embodiments, the disclosure provides a projection exposure apparatus
    having illumination optics for illuminating an object field with object field points in an object plane,
    having projection optics for imaging the object field into an image field in the image plane, the illumination optics having, for each object field point of the object field, an associated exit pupil with a greatest marginal angle value sin(γ) of the exit pupil, the illumination optics containing at least one multi-mirror array (MMA) having a multiplicity of mirrors for adjusting an intensity distribution in the associated exit pupils of the object field points, the illumination optics containing at least one optical system for temporally stabilising the illumination of the multi-mirror array (MMA)

so that, for each object field point, a first adjusted intensity distribution in the associated exit pupil deviates from a second adjusted intensity distribution in the associated exit pupil by less than the value 0.1 in the outer and/or inner σ.

According to the disclosure, a rapid change between annular settings which differ only slightly in the outer and/or inner σ, via a projection exposure apparatus having a multi-mirror array (MMA), can be produced particularly well when temporal stabilisation of the annular settings relative to the temporal and/or spatial fluctuations of the light source is provided in the form of temporal stabilisation of the illumination of the multi-mirror array (MMA).

According to the disclosure, it has been discovered that temporal stabilisation of the illumination of a multi-mirror array (MMA) of a projection exposure apparatus having fewer than 80,000 mirrors is advantageous for replicating the light mixing properties of a DOE, as already described above. It is therefore possible for a change, intended by the user of the projection exposure apparatus, between two annular settings differing only slightly in the outer and/or inner σ for the exposure process to be carried out reproducibly with high accuracy, without large fluctuations and with the least possible deviations relative to the desired structuring in the form of the annular settings. The user of the projection exposure apparatus according to the disclosure can therefore change rapidly as well as accurately, temporally stably and reproducibly between two annular settings or desired intensity distributions in the exit pupils, which differ only slightly in the outer and/or inner σ.

In certain embodiments, the disclosure refines illumination optics for a projection exposure apparatus for microlithography having a multi-mirror array (MMA) so that, for example, an intensity distribution in the exit pupils of object field points of an object field of the illumination optics is stabilised relative to temporal and/or spatial fluctuations of a light source of the projection exposure apparatus.

This can be achieved, for example, with an illumination optics for a projection exposure apparatus for microlithography for the homogeneous illumination of an object field with object field points in an object plane. The illumination optics have an associated exit pupil for each object field point of the object field, and the illumination optics contain at least one multi-mirror array (MMA) having a multiplicity of mirrors for adjusting an intensity distribution in the associated exit pupils of the object field points. There is an illumination ray bundle of illumination rays between a light source and the multi-mirror array (MMA). The illumination optics contain at least one optical system for temporally stabilising illumination of the multi-mirror array (MMA). The temporal stabilisation is carried out by superposition of illumination rays of the illumination ray bundle on the multi-mirror array (MMA).

According to the disclosure, superposition of illumination rays of an illumination ray bundle of a light source for the illumination of a multi-mirror array (MMA) advantageously leads to temporal stabilisation of the illumination and therefore to stabilisation of the intensity distribution in the exit pupils relative to temporal and/or spatial fluctuations of a light source of the projection exposure apparatus.

In some embodiments, the disclosure refines a multi-mirror array (MMA) for illumination optics for a projection exposure apparatus, where the multi-mirror array (MMA) is intended to be suitable for rapidly changing the structuring of exit pupils of object field points of illumination optics of a projection exposure apparatus.

This can be achieved, for example, by a multi-mirror array (MMA), which is suitable for illumination optics for a projection exposure apparatus for microlithography having an operating light wavelength λ of the projection exposure apparatus in the units [nm], where each mirror of the multi-mirror array is rotatable about at least one axis through a maximum tilt angle value sin(α) and having a minimum edge length, and the minimum edge length is greater than 200 [mm*nm]*sin(α)/λ.

The Inventors have discovered that a rapid change between two annular settings which differ only slightly in the outer and/or inner σ, can more easily be achieved with high accuracy, temporally stably and reproducibly by a projection exposure apparatus having a multi-mirror array (MMA), so long as a multi-mirror array (MMA) having more than 40,000 mirrors with an edge length of less than 100 μm and a maximum tilt angle of more than 4° is available for this with a wavelength of, for example, 193 nm. This is because the structuring of the exit pupil can then be composed very finely by spots of the individual mirrors and the projection exposure apparatus can be accommodated in an installation space acceptable to the user, as the following considerations will show.

In particular, however, the following considerations also and above all give handling instructions for multi-mirror arrays (MMA) having fewer than 40,000 mirrors and/or maximum mirror tilt angles of less than 4°.

The spot of diameter of an individual mirror of the multi-mirror array (MMA) is given, for ideal Fourier optics between the field plane of the multi-mirror array (MMA) and the pupil plane of the Fourier optics, in this plane by the product of the focal length of the Fourier optics and the full divergence angle of that part of the illumination ray bundle which leaves the individual mirror. On the other hand, the radius of the pupil in the pupil plane is given by the product of the focal length of the Fourier optics and the maximum tilt angle of an individual mirror. It follows from this that the ratio of the maximum tilt angle of an individual mirror to the full divergence angle of the part of the illumination ray bundle after the individual mirror is suitable as a measure of the resolution or graduation in the pupil plane. A low divergence angle and a high maximum tilt angle therefore ensure high resolution in the pupil, as is involved for changing between annular settings with only a small difference in the outer or inner σ. A low divergence angle as a first possible way of increasing the resolution in the pupil, however, also ensures small spots in the pupil and therefore also little mixing of the light of the spots in the pupil. The effect of this is that the structuring of the exit pupil depends on the temporal and/or spatial fluctuations of the light source, cf. the discussion above of the light mixing properties of a DOE.

A multi-mirror array (MMA) having a large number of mirrors in excess of 40,000 can with a very low divergence angle ensure that a region of an exit pupil is illuminated by many mirrors, so as to achieve averaging over these mirrors and therefore decoupling from the temporal and/or spatial fluctuations of the light source. Such a multi-mirror array (MMA) for a projection exposure apparatus for microlithography having about 40,000 mirrors can currently be implemented technologically only with great difficulty. Furthermore, multi-mirror arrays (MMA) having high values for the maximum tilt angle in excess of 4° are a further possible way of increasing the resolution in the pupil. Such multi-mirror arrays (MMA) likewise can currently be implemented technologically only with great difficulty.

Besides the resolution in the pupil, the size of the pupil is also a constraint which may be taken into account.

In a pupil plane of illumination optics, there is generally a field defining element (FDE) with intrinsic light mixing or a refractive optical element (ROE) with subsequent light mixing in a subsequent field plane. The light mixing serves in both cases to generate homogeneous illumination of the object field of the illumination optics. The functional configuration of these elements in the pupil plane involves a certain minimum size of the pupil. The size of the pupil in the pupil plane is determined by the maximum tilt angle and by the focal length of the Fourier optics between the multi-mirror array (MMA) and the pupil plane. If the maximum tilt angle cannot be increased further, it is therefore possible for example to increase the focal length of the Fourier optics. But since twice the focal length of the Fourier optics also defines the distance of the multi-mirror array (MMA) from the subsequent pupil plane, technical installation space limits are conventionally placed on any arbitrary increase of the focal length.

Besides the resolution in the pupil and the size of the pupil, the light loss in the illumination optics and the extraneous light in the pupil are also constraints which may be taken into account. The light loss in the illumination optics leads to a reduction in the throughput of substrates or wafers of a projection exposure apparatus. The extraneous light in the pupil, for example caused by scattered light or ghost images, leads in the worst case to certain desired structurings of the exit pupil not being achievable. As a rule, the extraneous light in the pupil will also lead to a change not being possible between annular settings which differ only slightly in the outer or inner σ, since fine resolution in the pupil will be prevented by the extraneous light. If light loss and extraneous light are to be avoided in illumination optics having a multi-mirror array (MMA), then it is desirable to take into account that there are lower limits for the minimum edge length of a mirror of a multi-mirror array (MMA) owing to diffraction effects, and therefore as a function of the wavelength λ of the illumination light of the projection exposure apparatus.

Besides the aforementioned constraints, the costs of illumination optics may be taken into account as a further constraint. It follows from this that a multi-mirror array (MMA), and therefore the area of the individual mirror of the multi-mirror array (MMA), also cannot be made arbitrarily large since the area of the multi-mirror array (MMA) together with the maximum tilt angle determine the geometrical flux, which is responsible for the diameter and therefore for the costs of the subsequent optics. Furthermore, the size of the object field of the illumination optics is thereby likewise co-determined for a given numerical aperture NA.

The present disclosure utilises the above discoveries in the multi-mirror array (MMA) according to the disclosure for illumination optics having a operating light wavelength λ in the units [nm]. Each mirror of the multi-mirror array (MMA) is in this case rotatable about at least one axis through a maximum tilt angle value $\sin(\alpha)$ and has a minimum edge length, the minimum edge length being greater than 200 [mm*nm]*$\sin(\alpha)/\lambda$. An advantage thereby obtained with illumination optics having such a multi-mirror array (MMA) according to the disclosure is that it allows a rapid change of the structuring of exit pupils of object field points of illumination optics of a projection exposure apparatus, which differ only slightly in the outer and/or inner σ. This change takes place accurately, temporally stably and reproducibly.

In certain embodiments, the disclosure refines an optical system for homogenising illumination of a multi-mirror array (MMA) of illumination optics for a projection exposure apparatus for microlithography.

This can be achieved, for example, by an optical system for homogenising illumination of a multi-mirror array (MMA) of illumination optics for a projection exposure apparatus for microlithography, where the optical system has an illumination ray bundle with a divergence and an illumination light direction from the light source to the multi-mirror array (MMA), and the divergence of the illumination ray bundle in the illumination light direction after the optical system is less than five times the divergence of the illumination ray bundle before the optical system.

The Inventors of the present disclosure have discovered that spatial homogenisation of the illumination of a multi-mirror array (MMA) of illumination optics by an optical system according to the disclosure of the illumination optics ensures temporal stabilisation of the illumination on the multi-mirror array (MMA) and therefore temporal stabilisation of the intensity distribution in the exit pupils. The illumination of the multi-mirror array (MMA) and the intensity distribution in the exit pupils are therefore decoupled by the homogenising optical system from the temporal and/or spatial fluctuations of the light source of the projection exposure apparatus. As mentioned above in the discussion of the relationship of the full divergence angle and the resolution in the pupil, the Inventors have furthermore discovered that the optical system for homogenising the illumination on the multi-mirror array (MMA) desirably does not substantially increase the divergence of the illumination ray bundle, since otherwise the desired resolution is not obtained in the pupil for a change of annular settings, which differ only to a small extent in the outer and/or inner σ.

In some embodiments, the disclosure refines an optical conditioning unit for conditioning an illumination ray bundle of a laser for illumination optics for a projection exposure apparatus for microlithography.

This can be achieved, for example, by an optical conditioning unit for conditioning an illumination ray bundle of a laser for illumination optics for a projection exposure apparatus for microlithography. The laser in this case has more than one coherent laser mode and a laser output. Furthermore, the illumination ray bundle has a divergence, a ray or bundle profile and a polarisation state. The optical conditioning unit modifies at least the divergence and/or the ray or bundle profile and/or the polarisation state of the illumination ray bundle between the laser output and the multi-mirror array (MMA).

The Inventors have discovered that under certain circumstances it is favourable to condition, prepare or modify the size of the illumination and/or the divergence angle and/or the polarisation state of the illumination ray bundle when it arrives on the multi-mirror array (MMA), so that a rapid change of the structuring of exit pupils of object field points can be carried out between two annular settings or desired intensity distributions in the exit pupils, which differ only slightly in the outer and/or inner σ. This is advantageous in particular when changing between two annular settings which differ greatly in the size of the intensity distribution in the exit pupils. Here, under certain circumstances, for one of the two settings it is more favourable to select a different number of mirrors of the multi-mirror array (MMA) and/or a different divergence angle of the illumination ray bundle (see the above discussion about the effect of the number of mirrors on the stabilisation of an intensity distribution in the exit pupils and about the effect of the full divergence angle of a part of the illumination ray bundle after a mirror on the resolution in the exit pupil). Likewise, for the imaging properties of one of the two settings, it may be favourable to change the polarisation state. This is also commensurately more likely when the two annular settings differ more greatly in the size of the intensity distribution in the exit pupils.

In certain embodiments, the disclosure provides a method for the microlithographic production of microstructured components, as well as a component which can be produced thereby. The method can include: providing a substrate onto at least some of which a layer of a photosensitive material is applied; providing a mask, which includes structures to be imaged; and/or providing an optical conditioning unit for illumination optics; and/or providing an optical system for illumination optics; and/or providing a multi-mirror array for illumination optics; and/or providing illumination optics for a projection exposure apparatus; and/or providing a projection exposure apparatus; projecting at least a part of the mask onto a region of the layer with the aid of projection optics of the projection exposure apparatus to produce a microstructured component.

In some embodiments the optical system, which is configured to produce a temporal modification of the incoherent superposition, includes a mirror, which has a mirror surface, and an actuator which is configured to produce a tilt of at least a portion of the mirror surface. By tilting at least a portion of the mirror surface illumination ray bundles are tilted as well and obliquely impinge on the optical integrator. This results in a lateral shift of the intensity distribution produced on the subsequent multi-mirror array. If the optical integrator includes two channel plates of a honeycomb condenser, it is possible to change the surface area on the channels of the second plate illuminated by illumination ray sub-bundles. This may prevent damages in the second channel plate which otherwise may be caused by too high intensities which occur if the first channel plate focuses the illumination ray sub-bundles on the second channel plate.

The concept of directing ray bundles onto channels (i.e. microlenses) of an optical integrator with temporarily varying angles of incidence may also be used if the superposition of incoherent illumination ray bundles is of no concern. Also in this case this concept avoids damages in a honeycomb optical integrator including two plates each including a plurality of microlenses.

A tilt of at least a portion of the mirror surface may be produced with the help of actuators that bend the mirror surface. In some embodiments, the actuator is configured to produce rotary oscillations of the mirror around a rotary axis, which is inclined to the optical axis by an angle distinct from 0°, such as by an angle of 90°. By controlling the amplitude of the rotary oscillations, it is possible to adapt the tilt of the mirror surface, which is produced by the rotary oscillations, to the specific desired properties which may change during the operation of the apparatus. For example, the divergence of the illumination ray sub-bundles has a strong effect on the size of the illuminated area on the channels of the second channel plate. If this divergence varies as a result of various influences, for example changing optical properties of optical elements as a result of heating effects, the amplitudes of the rotary oscillations may be adapted to the changing desired properties.

If the mirror shall be optically conjugated to the micromirror array, an arrangement may be desirable in which the mirror and the micro-mirror array are arranged in parallel planes. In this respect it may be advantageous if the optical system includes a polarization dependent beam splitting surface and a polarization manipulator which is arranged between the beam splitting surface and the mirror. Then it is possible to use the polarization dependent beam splitting surface as a folding mirror which is transparent for light which has been reflected from the mirror and has passed twice through the polarization manipulator.

In some embodiments, the object field has an illuminated object field surface has a size OF, and an illuminated surface of the multi-mirror array has a size AF, where $AF = c \cdot \sin(\gamma')/\sin(\alpha) \cdot OF$, c is a constant with $0.1 < c < 1$, and $\sin(\gamma')$ is the greatest marginal angle value among the greatest marginal angle values $\sin(\gamma)$ associated with the exit pupils of the object field points. An average reflectivity of the mirrors of the multi-mirror array for an angle of incidence between 0° and 60° is more than 25%. A standard deviation of the reflectivity of the mirrors of the multi-mirror array from the average reflectivity is, for an angle of incidence between 0° and 60°, less than 50% expressed in terms of the average reflectivity. The apparatus is configured for being operated as a scanner, and the intensity distribution of the exit pupils of the object field points are modified during the scan process. An illuminated solid angle range in the exit pupil associated with an object field point, which range is generated by a mirror of the multi-mirror array, has a maximum angle range value which is less than 5% expressed in terms of the greatest marginal angle value $\sin(\gamma)$ of the associated exit pupil. A solid angle range in the exit pupil associated with an object field point is illuminated with a non-zero intensity and an angle range value of less than 10% expressed in terms of the greatest marginal angle value of the associated exit pupil by at least two mirrors of the multi-mirror array. The greatest marginal angle value $\sin(\gamma)$ of the exit pupil associated with an object field point is greater than 0.2 for all object field points. At least one mirror of the multi-mirror array has a different surface content than another mirror of the multi-mirror array. At least one mirror of the multi-mirror array has a different shortest distance from its closest neighbouring mirror than another mirror of the multi-mirror array. The illumination optics includes at least two multi-mirror arrays, the at least two multi-mirror arrays differing from each other in at least one property of a mirror. The illumination optics further contain at least one optical system to temporally stabilize the illumination of the multi-mirror array so that, for each object field point, the intensity distribution in the associated exit pupil deviates from a desired intensity distribution in the associated exit pupil in the case of a centroid angle value $\sin(\beta)$ by less than 2% expressed in terms of the greatest marginal angle value $\sin(\gamma)$ of the associated exit pupil and/or, in the case of ellipticity by less than 2%, and/or in the case of a pole balance by less than 2%. The optical system can include an optical integrator. The integrator can be honeycomb condenser having a focal length of more than 5 m.

In some embodiments, the illumination ray bundle has a divergence and an illumination light direction from the light source to the multi-mirror array. The divergence of the illumination ray bundle in the illumination light direction after the optical system is less than twice the divergence of the illumination ray bundle before the optical system.

BRIEF DESCRIPTION OF THE DRAWINGS

Various features and advantages of the present disclosure may be more readily understood with reference to the following detailed description taken in conjunction with the accompanying drawings, in which:

FIG. 1 schematically shows a projection exposure apparatus for microlithography having illumination optics with a rod as an integrator as prior art;

FIG. 2 schematically shows a projection exposure apparatus for microlithography having illumination optics with an FDE as an integrator as prior art;

DETAILED DESCRIPTION

Figure 3:
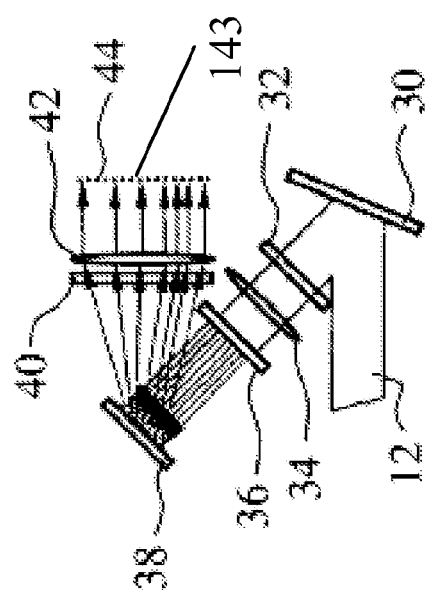
FIG. 3 schematically shows a pupil forming unit according to the disclosure of illumination optics according to the disclosure having a multi-mirror array (MMA) according to the disclosure.

FIG. 1 schematically shows an example of a prior art projection exposure apparatus for microlithography. A light source 1 generates an illumination ray bundle 12 whose cross section is changed in beam expansion optics 14. The illumination ray bundle 12 then impinges on a diffractive optical element 3a (DOE). The diffractive optical element 3a is arranged in a field plane of the illumination optics and generates an illumination angle distribution according to diffractive structures that are contained in the diffractive optical element 3a. Then, with the illumination angle distribution imposed by the diffractive optical element, the illumination ray bundle 12 passes through the optical module 2 and a subsequent pupil plane. This pupil plane (not indicated in FIG. 1) is arranged in the vicinity of a refractive optical element 3b. For further modifying the illumination ray bundle 12, the optical module 2 includes a zoom system schematically represented by a axially displaceable lens 22 and a pair of axicon elements 21. By retracting the axicon elements 21 from one another, it is possible to adjust the inner σ of a setting, or the borders of the cross section of the illumination ray bundle of an illumination setting. On the other hand, by changing the focal length of the zoom system, which involves a displacement of at least one lens 22 along the optical axis, it is possible to adjust the outer σ of an illumination setting, or generally the outer border of the illumination ray bundle cross section. By suitable configuration of the diffractive optical element 3a and by suitable selection of the position of the axicon elements 21 and of the zoom lens 22, it is possible to generate almost any desired intensity distribution at the output of the optical module 2, namely in the pupil plane arranged in the vicinity of the refractive optical element 3b.

The refractive optical element 3b imposes a field angle distribution on this intensity distribution of the illumination ray bundle 12 in the pupil plane, in order to obtain a desired field shape in a field plane, for example a rectangular field shape with an aspect ratio of 10:1. This field angle distribution of the illumination ray bundle 12 in the pupil plane is transferred by the subsequent field lens optics 4 into an illumination field 5e at the input of a rod 5. The illuminated field 5e at the input of the rod 5 lies in a field plane of the illumination optics and has an illumination angle distribution with a maximum illumination angle value which as a rule, but not necessarily, corresponds to the numerical aperture of the preceding field lens optics 4. In contrast to the field at the diffractive element 3a, the field 5e has the full geometrical flux of the illumination optics. This geometrical flux is the result of a twofold introduction of geometrical fluxes. First, geometrical flux for the pupil is introduced by the diffractive optical element 3a in order to adjust the illumination angle distribution in a subsequent field plane. In a second step, geometrical flux for the field is introduced by the refractive optical element 3b in order to adjust the illuminated field shape in the subsequent field plane, so that the full geometrical flux of the illumination optics is available subsequent to the optical element 3b.

The illuminated field 5e at the input of the rod 5 is transferred by the rod 5 to the output of the rod into a field 5a. The maximum illumination angles in the field 5a of the rod output correspond to those in the field 5e of the rod input. Multiple total reflections at the rod walls of the rod 5 create, at the rod exit in the exit pupils of the field points of the field 5a, secondary light sources with the field shape of the field 5e at the rod entry as the shape of each individual secondary light source. By this kaleidoscope effect of the rod 5, the field 5a is homogenised in respect of the intensity distribution over the field since the light of many secondary light sources is superposed in this field 5a.

A field stop 51 delimits the field 5a in its lateral extent and ensures a sharp bright-dark transition of the field. A subsequent, so-called REMA objective 6 images the field 5a into the reticle plane 7. The bright-dark edges of the field stop 51 are thereby transferred sharply into the object or field plane 7. This function of the sharp edge imaging of the field stop 51 into the reticle or field plane 7, also referred to as "reticle masking", leads to the name REMA (REticleMAsking) of this objective. The REMA objective 6 consists for example of a condenser group 61, a pupil region in the vicinity of a pupil plane 62, a pupil lens group 63, a deviating mirror 64 and a subsequent field lens group 65.

In the pupil region 62 of the REMA objective, for example, a wide variety of manipulations of the pupil may be carried out, particularly with regard to transmission or polarisation. The REMA objective 6 ensures imaging of the field 5a with the sharp field edges of the field stop 51 into the reticle plane (i.e. field plane 7). The illumination angle distribution of the field 5a is thereby also transferred into a corresponding illumination angle distribution in the field plane 7. Each object field point of the illumination field in the reticle plane (i.e. field plane 7) therefore obtains its illumination angle distribution, or its exit pupil.

In general, a REMA objective 6 illuminates the reticle or field plane 7 telecentrically, i.e. the illumination angle distribution of every object field point is symmetrical about the optical axis or an axis parallel thereto. The backward geometrical extension of the illumination light rays at an object field point of the field plane 7, in the direction of the illumination optics or light source 1, gives at infinity the virtual exit pupil of the illumination optics for this object field point. The forward projection of the illumination angle distribution of an object field point in the object field plane 7, in the direction of the subsequent projection optics 8, gives at infinity a real exit pupil of the illumination optics for this object field point being considered. The virtual or real exit pupil of the illumination optics is a direct consequence in the case of a telecentric beam path of the illumination optics in the field plane 7. The height of a point in the exit pupil relative to the centre of the exit pupil of an object field point is in this case given by the tangent of the illumination ray angle of this object field point multiplied by the distance of the exit pupil.

The object field plane 7 represents the dividing plane between illumination optics and projection optics, for example a projection objective 8, of a projection exposure apparatus. The illumination optics have the task of homogeneously illuminating a field delimited with sharp edges, and thereby producing a desired illumination angle distribution or exit pupil of an object field point according to the specifications.

In the scope of this application, the production of an illumination angle distribution of an object field point is equivalent in meaning here to producing an intensity distribution in the exit pupil of this object field point, since a particular illumination angle of an object field point is related via the tangent conditions to the corresponding position in the exit pupil.

Reticles or masks for chip production are introduced into the object field plane 7. These masks are illuminated via the illumination ray bundle 12 produced by the illumination optics. The projection objective 8 images the illuminated mask into a further field plane, the image field plane 10. There a substrate 9 is arranged which supports a photosensitive layer on its upper side. The mask structures are transferred by the projection objective 8 into corresponding exposed regions of the photosensitive layer. Generally speaking, there are two different types of projection exposure apparatus in this case, the so-called stepper in which the entire mask field is transferred onto the photosensitive substrate 9 in one exposure step, and the so-called scanner in which only parts of the mask are transferred onto parts of the substrate 9 in an exposure step, the mask and the substrate in this case correspondingly being moved in a synchronised fashion in order to transfer the entire mask.

After the exposure process step, the exposed substrate 9 is subjected to subsequent process steps, for example etching. As a rule, the substrate 9 subsequently receives a new photosensitive layer and is subjected to a new exposure process step. These process steps are repeated until the finished microchip, or the finished microstructured component, is obtained.

FIG. 2 schematically shows another example of a prior art projection exposure apparatus for microlithography. The elements in FIG. 2 which correspond to those in FIG. 1 are denoted by the same reference numerals.

The projection exposure apparatus in FIG. 2 differs from the projection exposure apparatus in FIG. 1 merely in the illumination optics. The illumination optics in FIG. 2 differ from the illumination optics in FIG. 1 in that the rod 5 for generating secondary light sources is absent. Furthermore, the illumination optics in FIG. 2 differ in that a field defining element 3c (FDE) ensures not only generation of the involved field angles in the pupil plane but also, through construction as a two-stage honeycomb condenser, generation of the secondary light sources. The field defining element 3c in FIG. 2 therefore includes both the functionality of the refractive optical element (ROE) 3b in FIG. 1 and the functionality of the rod 5 in FIG. 1. The field defining element 3c, configured as a two-stage honeycomb condenser, on the one hand introduces the field angle in the pupil plane and on the other hand generates the secondary light sources in the pupil plane. A corresponding field shape, with a desired homogenised intensity distribution over the field, is therefore generated in the subsequent field planes of the illumination optics by the superposition of light of the secondary light sources.

FIG. 3 schematically shows a pupil forming unit according to the disclosure for illumination optics for a lithographic projection exposure apparatus, as is represented for example in FIG. 1 or 2. Here, the pupil forming unit according to the disclosure in FIG. 3 serves as a replacement for the pupil forming unit 2 of this projection exposure apparatus according to FIG. 1 or 2. Use of the pupil forming unit of FIG. 3 is however not limited to these projection exposure apparatus as represented in FIG. 1 or 2.

The pupil forming unit of FIG. 3 ends in the pupil plane 44, which is arranged, in the exemplary embodiment shown in FIG. 1, in the vicinity of the refractive optical element 3b, and, in the exemplary embodiment shown in FIG. 2, in the vicinity of the field defining element 3c. Instead of the diffractive optical element 3a of FIGS. 1 and 2, a multi-mirror array (MMA) 38 produces an illumination angle distribution which is superposed in the pupil plane 44 to form an intensity distribution in this pupil plane. This intensity distribution of the pupil planes 44 corresponds to the intensity distribution in the exit pupil 143, or the illumination angle distribution of an object field point, so long as ideal Fourier optics are assumed.

An illumination ray bundle 12 coming from a light source and deviated by a plane folding mirror 30 is decomposed by a honeycomb condenser 32 into individual illumination ray sub-bundles and subsequently guided by relay optics 34, or a condenser 34, onto a lens array 36. This lens array 36 concentrates the illumination ray sub-bundles onto the individual mirrors of the multi-mirror array 38. The individual mirrors of the multi-mirror array 38 can be tilted differently, i.e. at least some of the mirrors of the multi-mirror array are rotatable about at least one axis in order to modify an angle of incidence of the associated illumination ray sub-bundle, so that different intensity distributions can be adjusted in the pupil plane 44. The illumination ray sub-bundles coming from the mirrors of the multi-mirror array 38 pass through a subsequent scattering disc 40 and condenser optics 42 so that they intersect, now desirably with parallel principal rays, the pupil plane 44.

Figure 4:
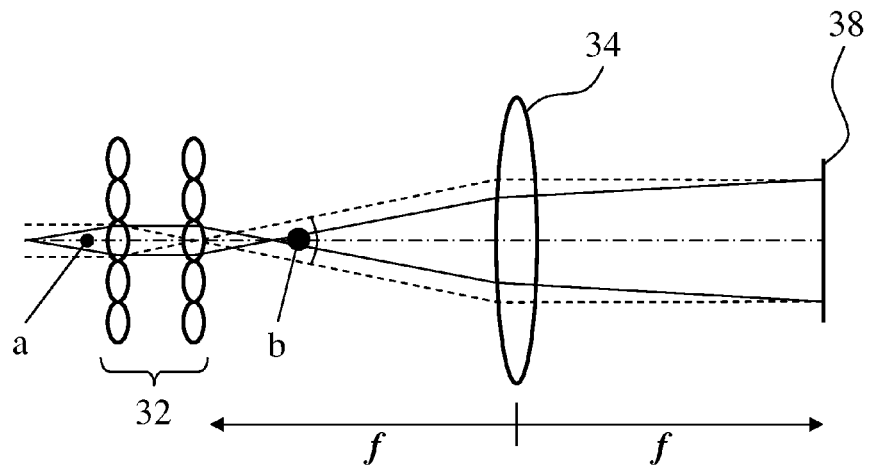
FIG. 4 schematically shows an optical system according to the disclosure for stabilising the illumination of a multi-mirror array (MMA) according to the disclosure.

FIG. 4 shows the section of FIG. 3 between the plane folding mirror 30 and the multi-mirror array 38 schematically and on an enlarged scale. In this illustration the optional lens array 36 between the condenser optics 34 and the multi-mirror array 38 is not shown. FIG. 4 shows an illumination ray sub-bundle of the illumination ray bundle 12 as it passes through the honeycomb condenser 32 and the condenser 34 onto the multi-mirror array 38. In this exemplary embodiment the condenser 34 forms Fourier optics having a front focal plane, in which a second honeycomb channel plate of the honeycomb condenser 32 is arranged, and a rear focal plane, in which the multi-mirror array 38 is arranged. The ray paths of selected rays of the illumination ray sub-bundle are represented in the form of solid and dashed lines, and the optical axis is represented in the form of a dot-and-dash line. The ray paths represented as solid line indicate rays which strike a first honeycomb channel plate of the honeycomb condenser 32 at an angle which is as large as possible. The ray paths represented in dashed form indicate rays which strike the first honeycomb channel plate of the honeycomb condenser 32 parallel to the optical axis, and therefore at an angle which is as small as possible.

The divergence of the illumination ray sub-bundle in front of the honeycomb condenser 32 is therefore given by the full aperture angle between the ray paths of the illumination rays of the illumination ray sub-bundle in the form of the solid line. This divergence is represented symbolically in FIG. 4 by the filled circle a. The filled area of the circle a is intended to be a measure of the divergence of the illumination ray sub-bundle.

After the honeycomb condenser 32, it is the ray paths represented as dashed lines which determine the divergence of the illumination ray sub-bundle. This divergence is in turn represented symbolically in the form of a filled circle b. The filled circle b has a larger area than the filled circle a before the honeycomb condenser, and therefore represents the divergence-increasing effect of a honeycomb condenser 32 on an illumination ray sub-bundle.

Figure 5:
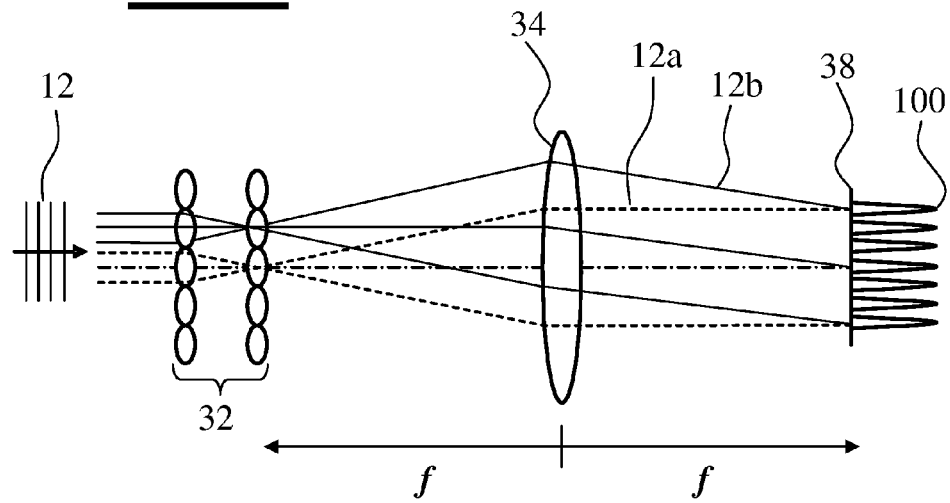
FIG. 5 schematically shows an optical system according to the disclosure for stabilising the illumination of a multi-mirror array (MMA) according to the disclosure with an intensity distribution over the multi-mirror array according to the disclosure.

FIG. 5 shows how two illumination ray sub-bundles (indicated with solid and dashed lines) of the illumination ray bundle 12 pass through two honeycomb channels of the honeycomb condenser 32 and impinge on the multi-mirror array 38. Both ray paths of the two illumination ray sub-bundles are associated with rays which arrive parallel to the optical axis and therefore perpendicularly on the honeycomb condenser 32. With the aid of FIG. 5, it may be seen that the two ray paths of the two illumination ray sub-bundles are superposed on the multi-mirror array 38 by the condenser 34. This is also illustrated with the aid of the ray paths 12a and 12b from the two honeycomb channels of the honeycomb condenser 32. The ray paths 12a and 12b are superposed at the same position on the multi-mirror array 38, even though they come from two different honeycomb channels.

If the two illumination ray sub-bundles shown in FIG. 5 have a high mutual spatial coherence, this can lead to periodic intensity variations on the multi-mirror array 38 when the two illumination ray sub-bundles are superposed on the multi-mirror array 38. Exemplary variations of this kind are illustrated in FIG. 5 by a function 100. This function 100 changes periodically between a maximum and minimum value as a function of the position over the multi-mirror array 38.

Figure 6:
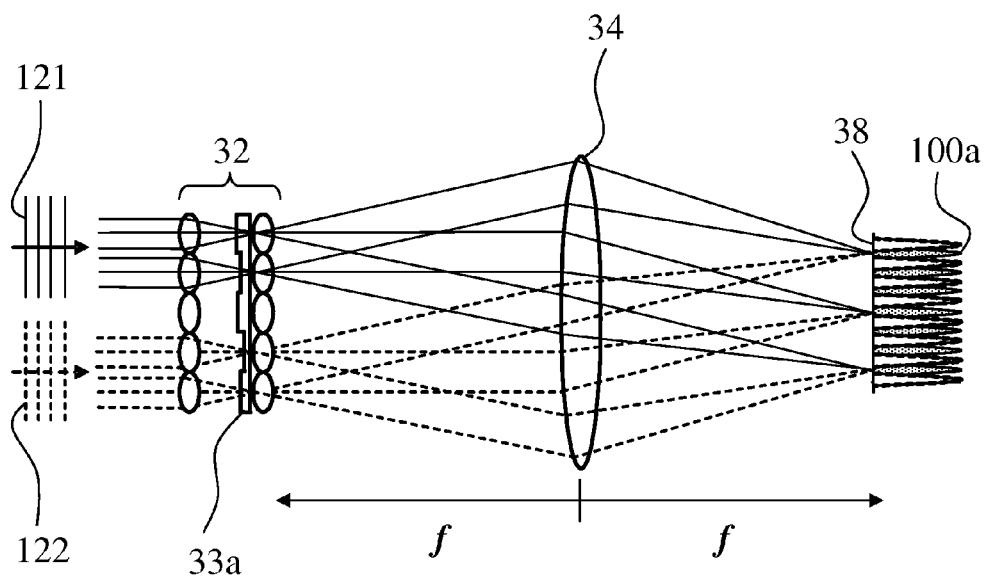
FIG. 6 schematically shows an optical system according to the disclosure for stabilising the illumination of a multi-mirror array (MMA) according to the disclosure with a periodic phase element according to the disclosure.

FIG. 6 schematically shows an exemplary embodiment which differs from the exemplary embodiment shown in FIG. 5 in that it includes a periodic phase element 33a which is used to avoid the spatial coherence. The upper part of FIG. 6 shows ray paths of the two illumination ray sub-bundles passing through the upper two honeycomb channels of the honeycomb condenser 32 similar to what has been shown in FIG. 5. It is assumed that the two illumination ray sub-bundles, which originate from an illumination ray sub-bundle 121 associated with the two upper honeycomb channels of the honeycomb condenser 32, are mutually spatially coherent.

However, as a result of the periodic phase element 33a arranged between the two honeycomb channel plates of the honeycomb condenser 32, the two illumination ray sub-bundles of the upper two honeycomb channels of the honeycomb condenser 32 are mutually shifted in phase, so that, in addition to the first spatially periodic intensity distribution over the multi-mirror array 38, a second spatially periodic intensity distribution over the multi-mirror array 38 is obtained which is spatially shifted relative to the first. The function 100a shows these two mutually spatially shifted periodic intensity distributions over the multi-mirror array 38. It may be seen clearly that the intensity as a sum of these two periodic intensity distributions no longer varies between the maximum value and the minimum value, but instead only between the maximum value and an average value. This means that owing to its periodic phase function, the phase element 33a leads to a reduction in the spatial interference phenomena over the multi-mirror array 38 due to the spatial coherence of the illumination ray sub-bundles. What has been the applies accordingly for the lower illumination ray sub-bundle 122 from which two mutually spatially coherent illumination ray sub-bundles originate and pass through the two lower honeycomb channels of the honeycomb condenser 32.

Figure 7:
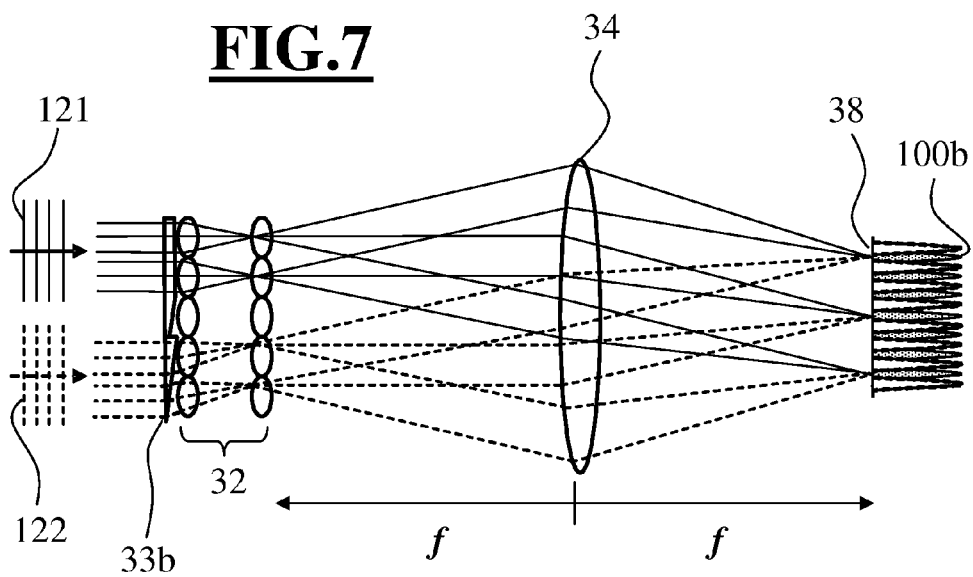
FIG. 7 schematically shows an optical system according to the disclosure for stabilising the illumination of a multi-mirror array (MMA) according to the disclosure with a phase element according to the disclosure having a random phase profile.

FIG. 7 schematically shows an alternative exemplary embodiment in which a phase element 33b having an arbitrary phase function is arranged in front of the honeycomb condenser 32 for reducing the spatial interference phenomena in the intensity distribution on the multi-mirror array 38. The desired second spatial intensity distribution on the multi-mirror array 38 is in this case produced by the two illumination ray sub-bundles passing through the lower two honeycomb channels of the honeycomb condenser 32. These two illumination ray sub-bundles are tilted by the phase element 33b before they enter the honeycomb condenser 32. Owing to the tilting before the honeycomb condenser 32, the two mutually spatially coherent illumination ray sub-bundles originating from the incident illumination ray sub-bundle 122 are shifted inside the second honeycomb condenser plate of the honeycomb condenser 32 so as to obtain a spatially shifted second periodic intensity distribution over the multi-mirror array.

The function 100b represents the two mutually spatially shifted periodic intensity distributions on the multi-mirror array 38. It may be seen that the total intensity as a sum of the two periodic intensity distributions now no longer varies between a maximum value and a minimum value, but instead the intensity varies merely between a maximum value and an averaged value. In contrast to the exemplary embodiment shown in FIG. 6, the variations of the spatial intensity distribution on the multi-mirror array 38, which are due to the spatial coherence of the illumination ray sub-bundles, are reduced not by two spatially coherent illumination ray sub-bundles contributing to two separate, mutually spatially shifted intensity distributions owing to a periodic phase element. Instead, this reduction is achieved by the two illumination ray sub-bundles with their spatial coherence contributing to a periodic intensity distribution which is shifted by the phase element 33b relative to the periodic intensity distribution of other spatially coherent illumination ray sub-bundles.

Figure 8:
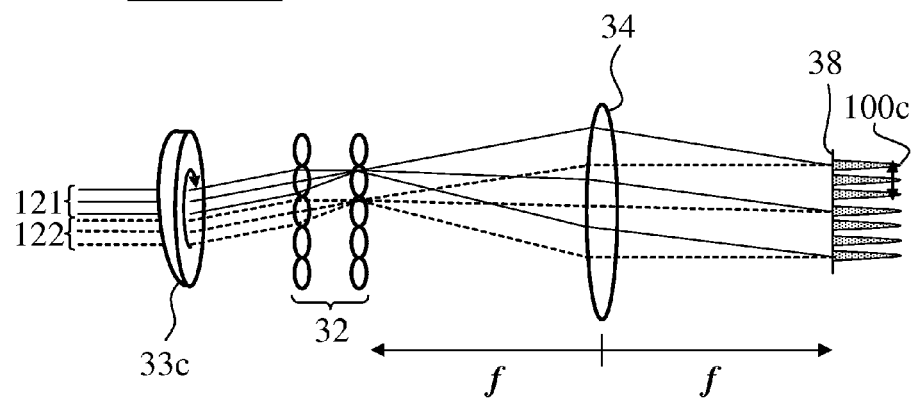
FIG. 8 schematically shows an optical system according to the disclosure for stabilising the illumination of a multi-mirror array (MMA) according to the disclosure with a rotating phase element according to the disclosure.

FIG. 8 schematically shows another exemplary embodiment in which a phase element 33c reduces the effect of the spatial coherence of illumination ray sub-bundles on the intensity distribution produced on the multi-mirror array 38. The phase element 33c is, in this exemplary embodiment, configured as a rotatable wedge. This wedge ensures that the spatial intensity distribution on the multi-mirror array 38 migrates to and fro as a function of time so that a time-averaged total intensity distribution varies between a maximum value and an averaged value. The intensity distribution 100c shown in FIG. 8 represents an instantaneous picture of the spatial intensity distribution over the multi-mirror array 38 for an arbitrary fixed position of the rotatable phase element 33c. When the phase element 33c rotates, this intensity distribution 100c periodically moves over the mirror array 38, as it is indicated by the double arrow shown in FIG. 8. Thus the intensity distribution on the multi-mirror array 38 is shifted as a function of time over the surface of the mirror array 38, which results in the intensity on a mirror of the multi-mirror array being averaged out over time.

Figure 9:
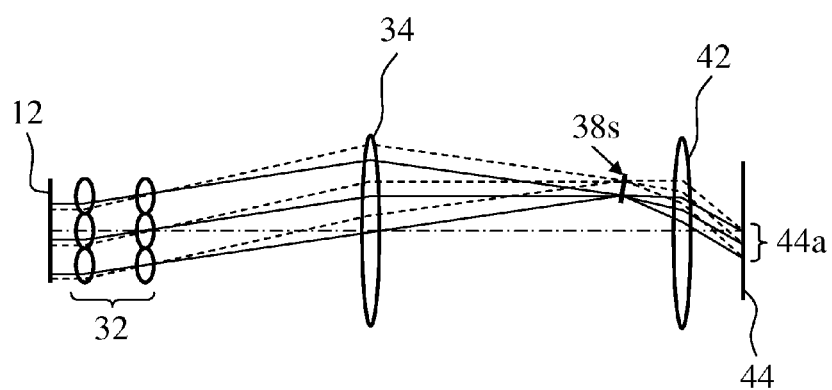
FIG. 9 schematically shows a beam path of an illumination ray bundle as far as the first pupil plane after the pupil forming unit according to the disclosure.

FIG. 9 schematically shows beam paths of the illumination ray bundle 12. The rays enter the honeycomb condenser 32, are reflected from one of the individual mirrors 38s of the multi-mirror array and finally pass through the pupil plane 44. The ray paths indicated by solid lines denote those illumination rays which pass through marginal zones (in the optical sense) of the individual channels of the honeycomb condenser 32. The ray paths indicated by dashed lines denote those illumination rays which pass right through the margins of the channels of the honeycomb condenser 32. The dot-and-dash line in FIG. 9 represents the optical axis.

All the rays shown in FIG. 9 emerging from the honeycomb condenser 32 pass through the condenser 34 and fall onto one of the individual mirrors 38s of the multi-mirror array 38. After being reflected from the mirror 38s, the rays are superposed on a surface element 44a of the pupil plane 44 with the help a further condenser 42. It is noted that the mirror 38s is shown in FIG. 9, for the sake of simplicity, as if it was transparent. In reality the condenser 42 and the pupil plane 44 are arranged along on optical axis which is inclined with regard to the optical axis on which the honeycomb condenser 34 is centred.

The condenser 42, which is arranged after the multi-mirror array in the propagation direction of the illumination ray bundle 12, is optional and may be omitted, particularly if curved mirrors 38s are used.

Figure 10:
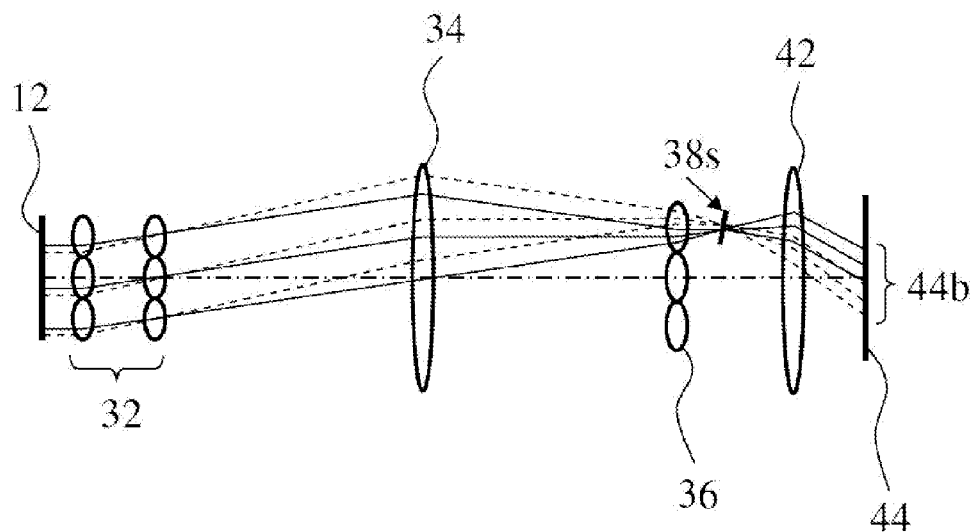
FIG. 10 schematically shows a beam path of an illumination ray bundle as far as the first pupil plane after the pupil forming unit according to the disclosure with a lens array according to the disclosure.

FIG. 10 shows beam paths similar to what has been shown in FIG. 9. In this exemplary embodiment, however, a lens array 36 is arranged between the condenser 34 and the multi-mirror array 38 including individual mirrors 38s. The lens array 36 ensures stronger concentration (focusing) of the rays on the individual mirrors 38s of the multi-mirror array 38. In the exemplary embodiment shown in FIG. 10, the rays indicated with solid and dashed lines are no longer superposed in the pupil plane 44 on a pupil element 44a by the subsequent condenser 42, but instead are positioned adjacent to one another so that they illuminate a larger surface element 44b in the pupil plane 44. By suitably dimensioning of the lens array 36, of a curvature of the reflecting surface of the individual mirrors 38s and of the condenser 42, it is possible to determine the size of the surface element 44b illuminated in the pupil plane by the individual mirror. As a result of such dimensioning, the surface element 44b illuminated in the pupil plane 44 may also be equal to or smaller than the corresponding surface element 44a in the exemplary embodiment shown in FIG. 9.

Figure 11:
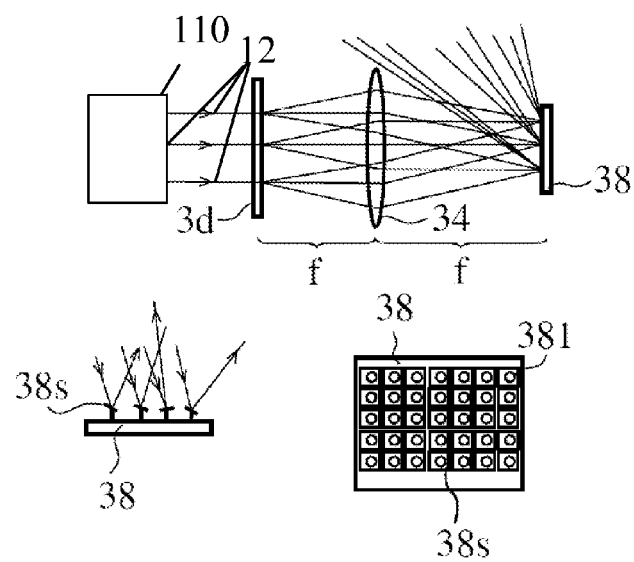
FIG. 11 schematically shows a conditioning unit according to the disclosure for conditioning the illumination of a multi-mirror array (MMA) according to the disclosure with a mixing and/or scattering element according to the disclosure.

FIG. 11 schematically shows another exemplary embodiment of the disclosure. Rays if an illumination ray bundle 12 are shown which enter a pupil forming unit and impinge on the multi-mirror array 38 of the pupil forming unit. The pupil forming unit of this exemplary embodiment includes a diffractive optical element 3d and a condenser or Fourier optics 34. The multi-mirror array 38 of this exemplary embodiment includes individual mirrors 38s as shown in the detail image. The individual mirrors 38s can be tilted about one or more axes. It is thus possible for the light rays incident on the individual mirrors 38s to be reflected in different, adjustable emergence directions.

The diffractive optical element 3d has the task of decomposing the illumination ray bundle 12 into a large plurality of illumination ray sub-bundles and superposing these illumination ray sub-bundles with the aid of the condenser 34 onto the individual mirrors 38s of the multi-mirror array 38, and at the same time concentrating or focusing them onto the individual mirrors 38s. This is represented schematically in a further detail view by the regions 381 illuminated on the respective individual mirrors 38s of the multi-mirror array 38.

Figure 12:
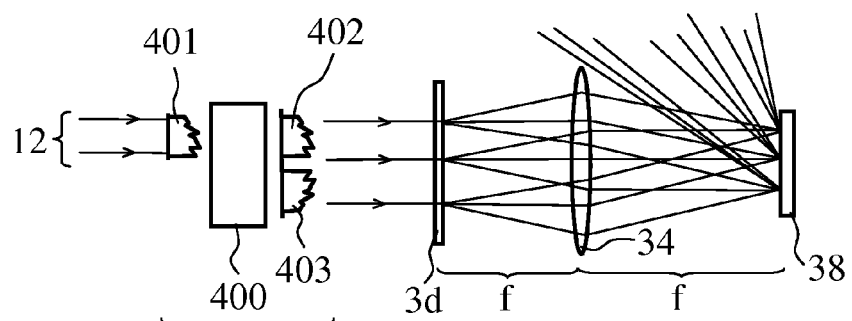
FIG. 12 schematically shows a conditioning unit according to the disclosure for conditioning the illumination of a multi-mirror array (MMA) according to the disclosure with a mixing and/or scattering element according to the disclosure and a symmetrising unit according to the disclosure.

FIG. 12 schematically shows an optical conditioning unit 400 which may be arranged in front of the pupil forming unit shown in FIG. 11. The optical conditioning unit 400 receives the illumination ray bundle 12, which has a certain intensity profile 401. At its output the optical conditioning unit 400 produces an illumination ray bundle which is symmetrical with respect to an optical axis (not shown in FIG. 12), wherein this illumination ray bundle has intensity sub-profiles 402 and 403 above and below the optical axis, respectively. At the output of the pupil forming unit including the DOE 3d, the condenser 34 and the multi-mirror array 38, according to FIG. 11, superposition of the two intensity profiles 402 and 403 takes place.

Figure 13:
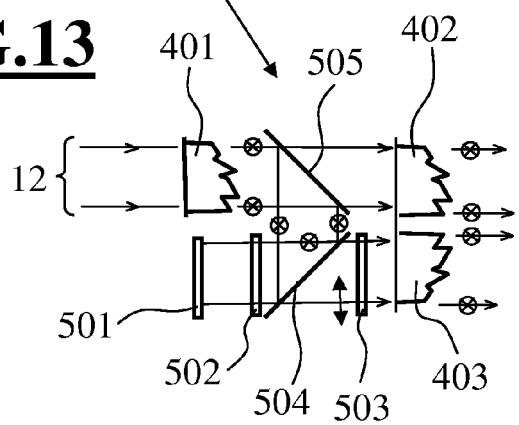
FIG. 13 schematically shows a symmetrising unit according to the disclosure for a conditioning unit according to the disclosure.

FIG. 13 schematically shows a detail of an exemplary embodiment of an optical conditioning unit 400 that is used in the exemplary embodiment shown in FIG. 12 and produces symmetrical intensity profiles 402 and 403. The illumination ray bundle 12 with the intensity profile 401 and a linear polarisation, which is perpendicular to the plane of the drawing as indicated in FIG. 13 by small circle symbols, is partially transmitted through a semitransparent mirror 505. Behind the mirror 505, i.e. at the output of the optical conditioning unit 400, the illumination ray bundle has an intensity profile 402 and is linearly polarised with a polarization direction perpendicular to the plane of the drawing.

The other part of the illumination ray bundle 12 is reflected at the semitransparent mirror 505 while preserving the polarisation. This reflected part is reflected again by a polarization dependent beam splitter 504 in a direction counter to the original light direction of the illumination ray bundle 12. This part of the illumination ray bundle 12 subsequently passes through a λ/4 plate 502, which may also be replaced by an optical rotator that rotates the polarization direction by 45°. The state of polarisation of this part of the illumination ray bundle 12 is thereby converted into a circular polarisation (not represented). This converted part of the illumination ray bundle 12 is subsequently reflected at the mirror 501 and again passes through the λ/4 plate 502 on its return path. The circular polarisation of the light is thereby converted into a linear polarisation with a polarization direction parallel to the plane of the drawing.

It is therefore possible for the remaining part of the illumination ray bundle 12 to pass through the polarizer 504 on the return path as linearly polarised light with a polarization direction being parallel to the plane of the drawing. A subsequent λ/2 plate 503 rotates the polarisation direction of the linearly polarised light back from the orientation parallel to the plane of the drawing to an orientation perpendicular to the plane of the drawing, so that a second intensity profile 403 with a linear polarisation perpendicular to the plane of the drawing is obtained at the output of the optical conditioning unit 400. This intensity profile 403 has a mirror-symmetric intensity shape with respect to the intensity profile 402.

Figure 14:
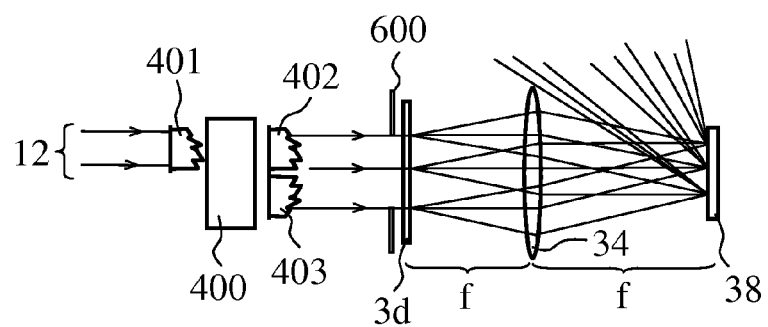
FIG. 14 schematically shows a conditioning unit according to the disclosure for conditioning the illumination of a multi-mirror array (MMA) according to the disclosure with a mixing and/or scattering element according to the disclosure and a symmetrising unit according to the disclosure and a stop according to the disclosure.

FIG. 14 shows an exemplary embodiment which differs from the exemplary embodiment shown in FIG. 12 in that an additional stop device 600 is provided. The stop device 600 is used to delimit the illumination ray bundle 12 having the symmetrized intensity profiles 402 and 403, so that any scattered light generated in the conditioning unit 400 can advantageously be stopped out.

Figure 15:
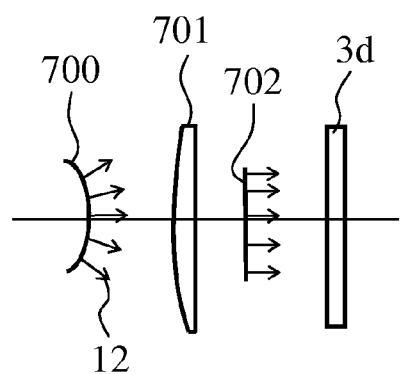
FIG. 15 schematically shows a phase element according to the disclosure for a conditioning unit according to the disclosure.

FIG. 15 schematically shows a phase element 701 which may optionally be arranged in front of the diffractive optical element 3d of the exemplary embodiment according to one of FIGS. 11, 12 and 14. The phase element 701, which may be or include an aspherical lens element and/or a lens element with a freeform surface, serves to adapt the wavefront 700 of the illumination ray bundle 12. FIG. 15 shows a wavefront 700 of the illumination ray bundle 12 before it passes through the phase element 701. FIG. 15 furthermore shows the wavefront 702 of the illumination ray bundle 12 after the phase element 701. It may be seen clearly that the wavefront 702 after passing through the phase element 701 has, for example, a smaller curvature than the original wavefront 700 of the illumination ray bundle 12. By suitable selection of the phase element 701, it is therefore possible to modify the wavefront of the illumination ray bundle 12 before it enters the illumination optics of a projection exposure apparatus for microlithography. By modifying the curvature of the wavefront of an illumination ray bundle 12, its divergence is also changed. The phase element 701 in FIG. 15 therefore serves not only to modify the curvature of the wavefront of an illumination ray bundle 12, but also to modify or condition the divergence of the illumination ray bundle 12.

Figure 16:
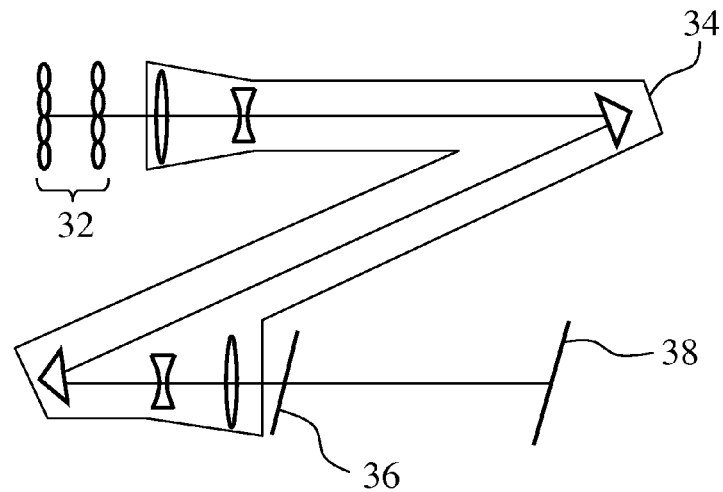
FIG. 16 schematically shows an optical system according to the disclosure for stabilising the illumination of a multi-mirror array (MMA) according to the disclosure with a honeycomb condenser according to the disclosure as an integrator according to the disclosure and tele- or relay optics according to the disclosure.

FIG. 16 schematically shows a pupil forming unit according to the disclosure including a honeycomb condenser 32, condenser or relay or tele-optics 34, a lens array 36 and a multi-mirror array 38. Since the honeycomb condenser 32, as shown in FIG. 4, does not substantially increase the divergence of the illumination ray bundle, it is desirable to use a condenser or relay optics 34 having a large focal length in order to be able to convert these low divergences into corresponding heights relative to the optical axis on the multi-mirror array 38. For technical installation space reasons, it is therefore expedient for this condenser or relay optics 34 having a large focal length to be folded by prisms or mirrors.

Figure 17:
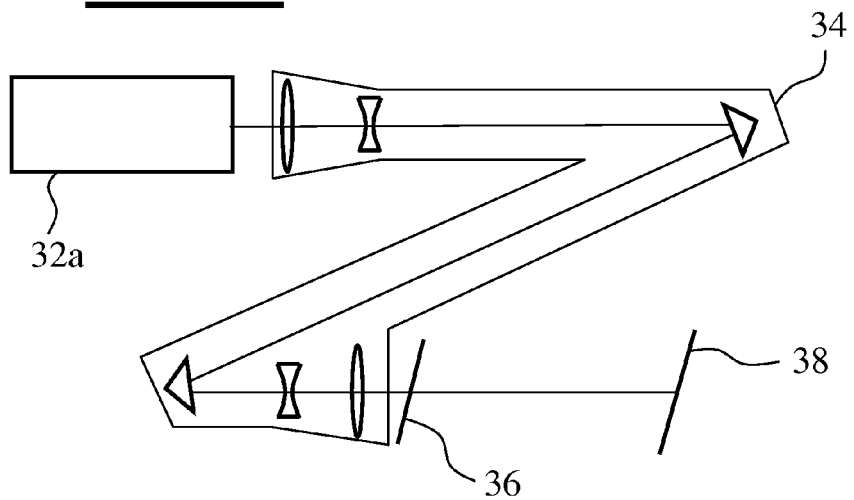
FIG. 17 schematically shows an optical system according to the disclosure for stabilising the illumination of a multi-mirror array (MMA) according to the disclosure with a rod according to the disclosure or a light guide according to the disclosure as an integrator according to the disclosure and tele- or relay optics according to the disclosure.

FIG. 17 schematically shows an alternative pupil forming unit in which, compared with the exemplary embodiment shown in FIG. 16, the honeycomb condenser 32 has been replaced by a suitable rod 32a, a light-guiding optical fibre 32a or a light-guiding fibre bundle 32a.

Figure 18:
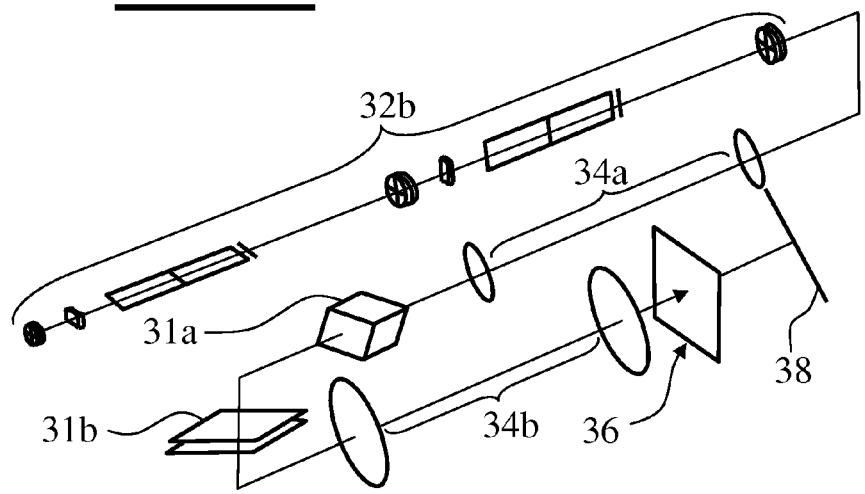
FIG. 18 schematically shows an optical system according to the disclosure for stabilising the illumination of a multi-mirror array (MMA) according to the disclosure with a plate mixer condenser according to the disclosure as an integrator according to the disclosure and tele- or relay optics according to the disclosure.

FIG. 18 schematically shows another exemplary embodiment of a pupil forming unit according to the disclosure. In this exemplary embodiment the relay or condenser optics 34 are divided into two separate relay optics 34a and 34b. In contrast to the previous exemplary embodiments, an optical system, which is formed by "auxiliary lenses" of two thin optical plates placed mutually perpendicularly, is used as the light mixing instrument 32b in FIG. 18. The two thin plates placed mutually perpendicularly ensure the desired light mixing effect on the multi-mirror array 38.

In the exemplary embodiment shown in FIG. 18, an optional beam forming unit 31a ensures adaptation of the size and the divergence of the illumination ray bundle. It is indicated by two section planes 31b perpendicular to the ray propagation direction that elements according to the disclosure of the pupil forming unit and/or of the conditioning unit of the illumination optics may also lie before the housing wall of the illumination optics, indicated by 31b.

Figure 19:
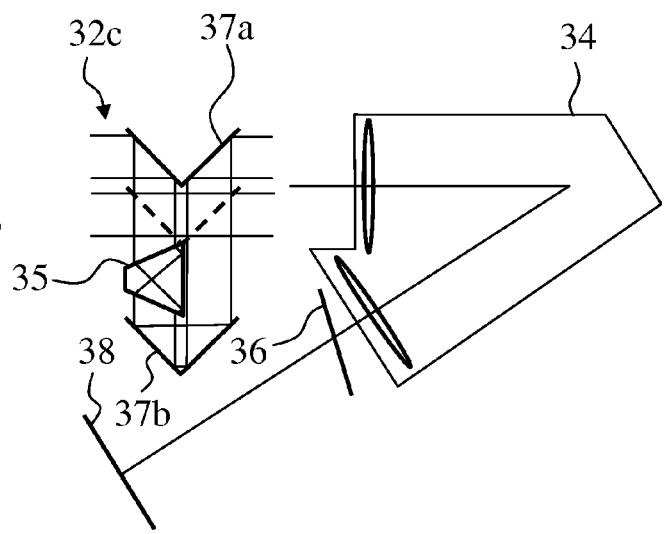
FIG. 19 schematically shows an optical system according to the disclosure for stabilising the illumination of a multi-mirror array (MMA) according to the disclosure with a cube mixer according to the disclosure as an optical conditioning unit according to the disclosure, which simultaneously serves as a simple integrator according to the disclosure, and tele- or relay optics according to the disclosure.

FIG. 19 schematically shows another exemplary embodiment of a pupil forming unit according to the disclosure. In this exemplary embodiment an optical conditioning unit 32c is used to symmetrize an illumination ray bundle at the output of the conditioning unit 32c without thereby resorting to the polarisation properties of the light for the symmetrization. A part of the illumination ray bundle is deviated by mirrors 37a and 37b. This part of the illumination ray bundle then passes through a so-called dove prism 35. The actual mirroring or symmetrization of the illumination ray bundle takes place inside the dove prism 35, so that at the output of the optical conditioning unit 32c there is an illumination ray bundle which is formed by two illumination ray sub-bundles mutually symmetrized with respect to an axis along the propagation direction of the light.

In the exemplary embodiment according to FIG. 19, it is possible to dispense with further light mixing with the help of a further light mixing unit, for example a honeycomb condenser or a rod. Combinations with the other light mixing units, for example those mentioned, are nevertheless possible. Depending on the quality of the light produced by the light source and forming the illumination ray bundle 12, it may be sufficient in the exemplary embodiment according to FIG. 19 to use the symmetrization property of the optical conditioning unit 32c without additional light mixing to homogenize the illumination of the multi-mirror array 38.

Figure 20:
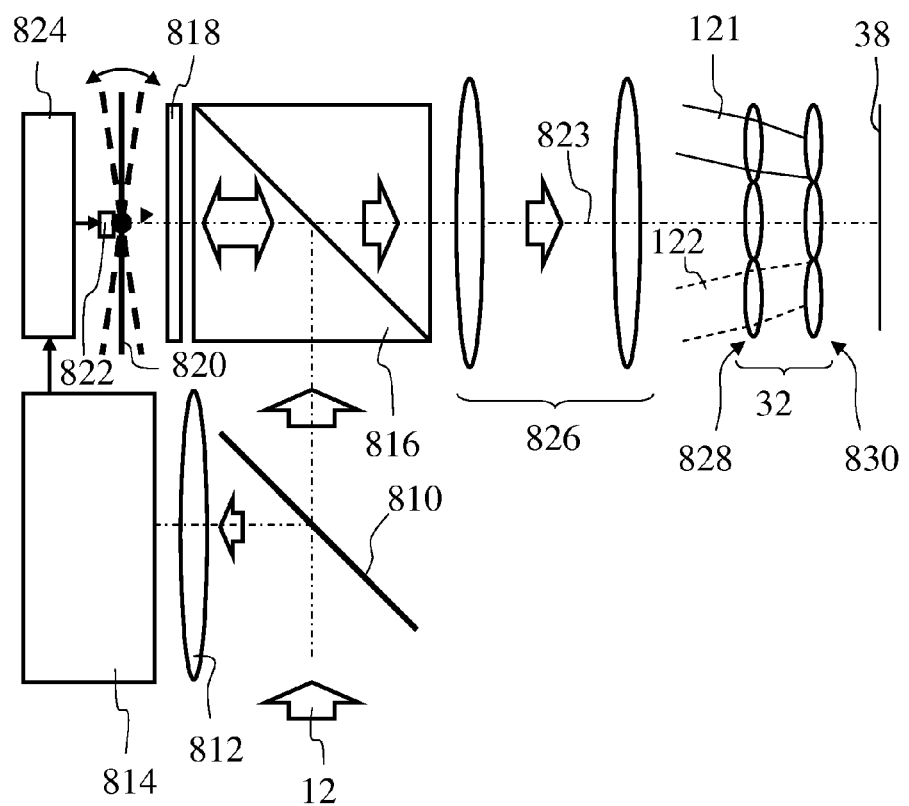
FIG. 20 schematically shows a meridional section through an optical system of the disclosure for stabilizing the illumination of a multi-mirror array, including a mirror which is capable of performing rotary oscillations.

FIG. 20 schematically shows another exemplary embodiment of an optical system which reduces the effect of the spatial coherence of illumination ray sub-bundles on the intensity distribution produced on the multi-mirror array 38. In contrast to the exemplary embodiment shown in FIG. 8, in which a rotating transparent wedge is used to tilt the illumination ray sub-bundles, the exemplary embodiment shown in FIG. 20 uses a mirror, which is capable of performing rotary oscillations, to achieve a similar effect. However, in the exemplary embodiment shown in FIG. 20 the illumination ray sub-beams 121, 122 are tilted only in the plane of the drawing sheet, whereas the bundles 121, 122 shown in FIG. 8 perform a rotation around the optical axis. Apart from that, the exemplary embodiment shown in FIG. 20 makes it possible to vary (if needed) the maximum tilting angles of the illumination ray sub-bundles, as will become clear from the following description:

The exemplary embodiment shown in FIG. 20 includes a beam splitter plate 810 which splits off a small portion of an incident illumination ray bundle 12 and directs this portion towards Fourier optics 812. After having passed the Fourier optics 812, the split off portion impinges on a divergence measurement unit 814 which contains a position resolving sensor, for example a CCD sensor. The divergence measurement unit 840 is configured to measure the divergence of the split off portion of the illumination ray bundle 12.

The remaining portion of the illumination ray bundle 12 passes through the beam splitter plate 810 and impinges on a polarization dependent beam splitting cube 816. The incident illumination ray bundle 12 is in a linear state of polarization which is selected such that the beam splitting cube 816 completely reflects the illumination ray bundle 12. The reflected bundle 12 passes through a quarter waveplate 818 and impinges on a plane mirror 820 which can perform rotary oscillations about a rotational axis which runs perpendicular to an optical axis 823 of the optical system. An actuator 822 is coupled to the mirror 820 and exerts forces on the mirror 820 such that it performs rotary oscillations, as is indicated by dashed lines and a double arrow in FIG. 20. The actuator 822 is connected, via a mirror control unit 824, to the divergence measurement unit 814.

On the opposite side of the beam splitting cube 816 relay optics 826 are provided that images the mirror 820 onto the first channel plate 828 of the honeycomb condenser 32.

In the following the function of the optical system shown in FIG. 20 will be explained:

The portion of the illumination ray bundle 12 which has been reflected by the beam splitting cube 816 impinges on the quarter waveplate 818. There the linear state of polarization is converted into a circular state of polarization. The circularly polarized light impinges on the oscillating mirror 820 so that, at a given instant, the propagation direction of the illumination ray bundle 12 is tilted by a degree which is determined by the instantaneous rotary angle of the mirror 820.

After being reflected from the mirror 820, the illumination ray bundle 12 propagates again through the quarter waveplate 818. The circular state of polarization is then converted back to a linear state of polarization which is, however, orthogonal to the linear state of polarization of the illumination ray bundle 12 that has been reflected by the beam splitter cube 816. As a result of this orthogonal state of polarization, the illumination ray bundle 12 now passes through the beam splitting cube 816 and finally impinges, after having passed the relay optics 826 and the honeycomb condenser 32, on the micro-mirror array 38.

Due to the rotary oscillations of the mirror 820, the illumination ray sub-bundles 121, 122 obliquely impinge on the honeycomb condenser 32. The tilt angles, under which the illumination ray bundles impinge on the honeycomb condenser 32, periodically vary in time with a period which is determined by the period of the rotary oscillations of the mirror 820. In FIG. 20 this continuous tilting of the illumination ray sub-bundles is illustrated for the illumination ray sub-bundle 121 in solid and dashed lines.

Figure 21:
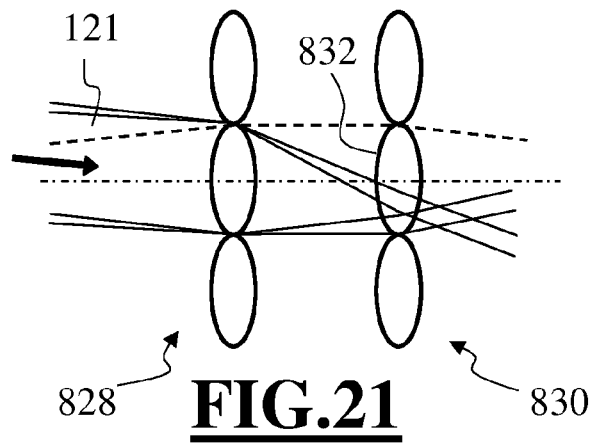
FIGS. 21 to 23 schematically show the illumination of a honeycomb condenser including two channel plates at three different instants, at which illumination ray sub-bundles impinge under different angles of incidence on the first channel plate.
Figure 22:
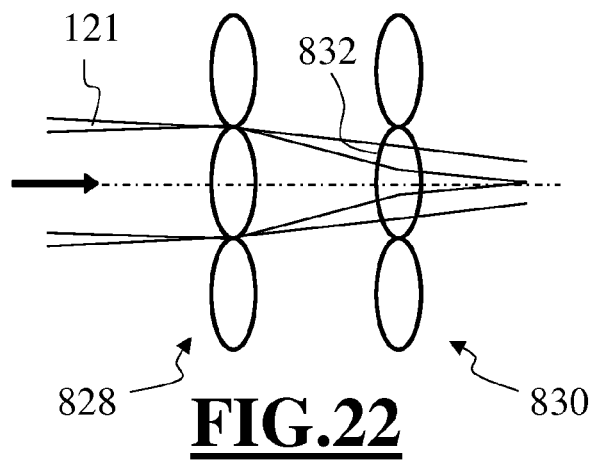
Figure 23:
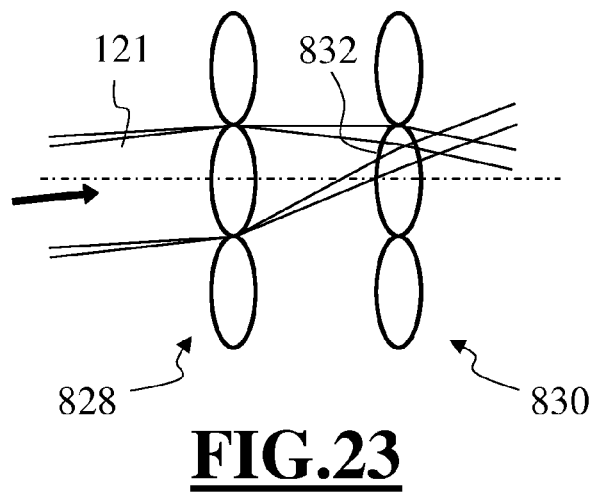

The effect of this continuously oscillating tilting of the illumination ray sub-bundles 121 will now be explained in more detail with reference to FIGS. 21, 22 and 23 which show the illumination ray sub-bundle 121, which has a small divergence and on the honeycomb condenser 32, at three different instants. As can be seen in FIG. 21, the illumination ray sub-bundle 121, which completely illuminates a channel of the first channel plate 828 of the honeycomb condenser 32, converges towards the corresponding channel of the second channel plate 830. At the instant shown in FIG. 21, only a lower portion of a light entrance surface 832 of this channel of the second channel plate 830 is illuminated by the illumination ray sub-bundle 121.

At a later instant shown in FIG. 22 the illumination ray sub-bundle 121 is tilted by the mirror 820 such that it propagates parallel to the optical axis 823. Now a central portion of the corresponding channel of the second channel plate 830 is illuminated by the con-verging illumination ray sub-bundle 821.

At a still later instant the illumination ray sub-bundle 121 is tilted such that an upper portion of the corresponding channel of the second channel plate 830 is illuminated, see FIG. 23. From this it becomes clear that it is possible to (almost) homogeneously illuminate the light entrance surface 832 of the second channel plate 830 by suitably selecting the maximum amplitude of the rotary oscillations of the mirror 830. This is advantageous because the transparent material, from which the second channel plate 830 is made, may be damaged if the light intensities are too large. Such large light intensities may occur if the illumination ray sub-bundles 121 are focused by the channels of the first channel plate 828 such that the focal points lie within the channels of the second channel plate 830.

If the divergence of the illumination ray sub-bundle 121 does not vary during time, the focal length of the channels of the first channel plate 828 may be determined such that the focal points do not lie within the channels of the second channel plate 830. However, under usual circumstances variations of the divergence of the illumination ray sub-bundles 121 cannot be completely prevented. Under such conditions it is possible that the divergence changes to an extent that leads to untolerable intensities in the second channel plate.

The optical system shown in FIG. 20 prevents such damages by spatially varying the areas which are illuminated on the light entrance surfaces 832 of the channels of the second channel plate 830.

In order to avoid that, as a result of changes of the divergence of the illumination ray sub-bundles 121, the illuminated areas on the channels of the second channel plate 830 become too small, or that these areas extend to adjacent channels which is desirably avoided, too, the optical system measures the divergence of the incoming illumination ray bundle 12 via the divergence measurement unit 814. The measurement values are communicated to the mirror control unit 824 which controls the maximum amplitudes of the rotary oscillations produced by the actuator 822 in such a manner that the conditions shown in FIGS. 21, to 23 prevail, i.e. the light entrance surfaces 832 of the second channel plate 830 are—although not at any arbitrary instant, but integrally over time—completely illuminated, or at least illuminated over an area that prevents damages caused by too high light intensities.

In the following, some additional exemplary embodiments will be described:

If the divergence is known, or its variations are within known ranges, the beam splitter plate 810, the Fourier optics 812 and the divergence measurement unit 814 may be dispensed with.

In another exemplary embodiment, the mirror 820 does not perform rotary oscillations. but is bent with the help of suitable actuators, with a bending axis extending perpendicular to the plane of the drawing sheet.

In another alternative exemplary embodiment the beam splitting cube 816 and the quarter waveplate 818 are dispensed with. The mirror 820 is arranged such that its surface normal (in neutral position) forms an angle with regard to the direction of the incoming illumination ray bundle 12. In other words, the mirror 820 is then used as a folding mirror. As a result of this inclined orientation, the honeycomb condenser 32 may be arranged in an inclined manner as well, in particular in accordance with the Scheimpflug condition.

In still another exemplary embodiment the relay optics 826 are dispensed with. However, in this case not only the angles of incidence, but also the areas, where the illumination ray sub-bundles 121 impinge on the first channel plate 828, will vary in time. If this can be tolerated, the omission of the relay optics 826 significantly simplifies the design of the optical system.

In another alternative exemplary embodiment the quarter waveplate 818 is replaced by another polarization manipulator, for example a polarization rotator that rotates the polarization direction by an angle of 45°. Such a polarization rotator may include optically active materials, for example.

Figure 24:
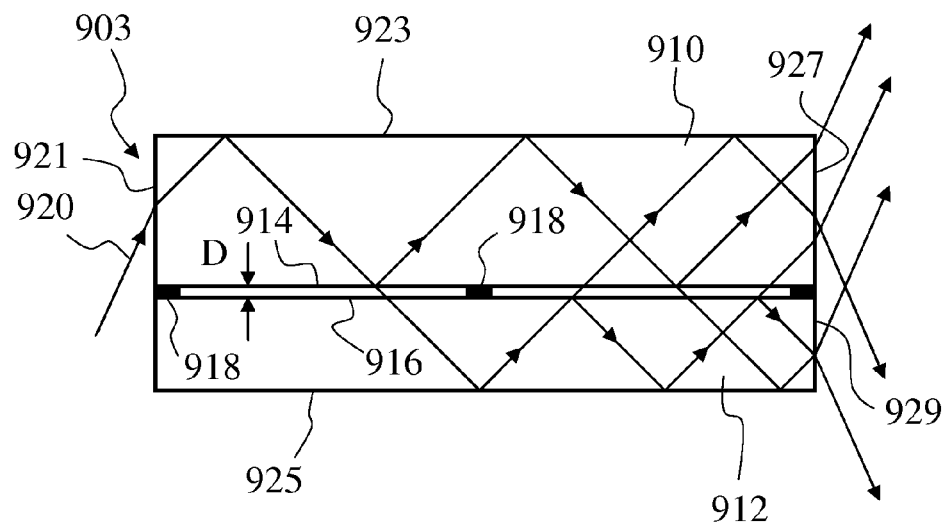
FIG. 24 schematically shows a cross-section through a mixing element according to an embodiment in which evanescent waves propagate between two rods spaced apart by a small distance.

FIG. 24 schematically shows a section through a mixing element 903 which may be used instead of the diffractive optical element 3*d* in the arrangement shown in FIG. 11. The mixing element 903 includes a first rod 910 and a second rod 912 which are transparent for the illumination ray bundles. The first rod 910 has a first surface 914, and the second rod 912 has a second surface 916 which is arranged adjacent the first surface 914 of the first rod 910. The first surface 914 and the second surface 916 are parallel to each other and are spaced apart by a distance D which is so small that at least a substantial portion of light guided by total internal reflection within the first rod 910 couples into the second rod 912 as evanescent waves.

Such evanescent waves are a side effect if total internal reflection occurs. The evanescent waves propagate across the boundary surface between the two adjoining optical media. Under ordinary conditions evanescent waves do not transmit any energy. However, if the distance between the two media is less than several wavelengths, i.e. there is a thin interspace filled with a third medium, the evanescent wave transfer energy across the interspace into the second medium across the third medium. The smaller the distance is, the larger is the fraction of light which couples into the second medium. This effect, which is very similar to quantum tunneling, is also referred to as frustrated total internal reflection.

In order to be able to keep the distance D between the first and second surfaces 914, 916 smaller than a few wavelengths of the light, the surfaces 914, 916 are desirably plane because this simplifies a parallel arrangement of the surfaces 914, 916 with such a short distance D. In the exemplary embodiment shown the distance D is determined by spacers 918 which are arranged between the surfaces 914, 916. The spacers 918 may be formed by stripes of a thin film, for example a gold film, or sputtered structures. The rods may have almost any cross section, for example rectangular with an aspect ratio such that the rod has the shape of a thin slab.

Reference numeral 920 denotes a centroid ray of an illumination sub-bundle. If this ray 920 is coupled into a front end face 921 of the rod 910 with a suitable angle of incidence, it can be ensured that the angle of incidence on its lateral surface 923 is greater than the critical angle, so that total internal reflection occurs at this lateral surface 923.

If the ray 920 reflected from lateral surface 923 is incident on the first surface 914, a fraction of the light is able to couple into the adjoining second rod 912 so that a beam splitting function is achieved. A reflected portion is directed again towards the lateral surface 923, and the transmitted portion impinges on the lateral surface 925 of the second rod 912. Each time a ray impinges on one of the first or second surfaces 914, 916 it will be split into two rays in this manner.

From the opposite rear end faces 927, 929 of the rods 910, 912 a plurality of rays emerge that carry a fraction of the intensity of the ray 920 before it is coupled into the rod 910. The fraction depends on the geometrical parameters of the mixing element 903, in particular on the distance D, the angle of incidence on the front end face 921 and the length and thickness of the rods 910, 912.

If a larger portion of the front end face 921 of the mixing element 903 is illuminated with an illumination ray bundle, a very effective light mixing effect is achieved with a mixing element 903 having a short longitudinal dimension. One of the most prominent advantages of this exemplary embodiment is that no light is lost at the optical boundaries. The only light loss occurs as a result of light absorption within the rods 910, 912 which can be kept very low if highly transparent optical media are used.

In order to reduce polarization dependencies, the light bundles propagating through the mixing elements 903 is desirably in an s-state of linear polarization.

In one exemplary embodiment the illumination ray bundle has a wavelength of 193 nm, the angle of incidence with respect to the first and second surfaces 914, 916 is 45°, and the distance D is 100 nm, i.e. about one half of the light wavelength. This will result in a beam splitting ratio of about 50:50 at the surfaces 914, 916. Rods having the desired flatness and minimum roughness are commercially available, for example, from Swissoptic, Switzerland.

Figure 25:
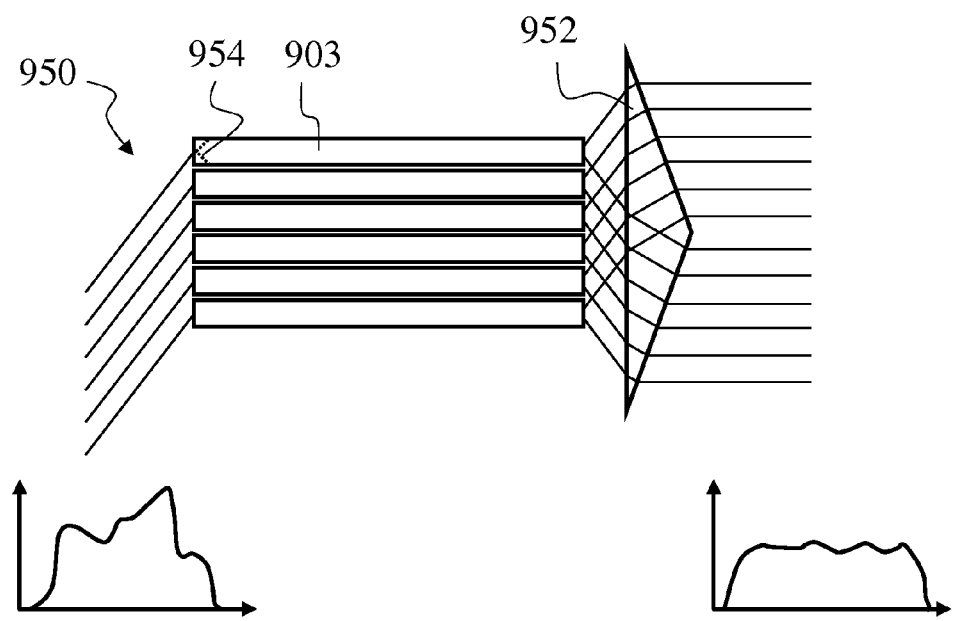
FIG. 25 schematically shows a mixing unit including a plurality of mixing elements as shown in FIG. 24.

FIG. 25 is a schematic cross-section through a mixing unit 950 which includes a plurality of mixing elements 903 as shown in FIG. 24. The mixing elements 903 in this exemplary embodiment have a thickness in the order of 1 mm to 2 mm and a length between 10 mm and 50 mm and may consist of calcium fluoride, magnesium fluoride, quartz or fused silica. The thicknesses of the mixing element 903 do not have to be equal.

A prism 952 is arranged behind the rear end faces of the mixing elements 903. The prism 952 tilts the ray bundles emerging from the rear end faces under various directions such that the ray bundles run parallel. To this end the prism 952 has two inclined end faces whose inclination is adapted to the angles and which the ray bundles emerge from the mixing elements 903. Instead of the prism 952 a suitable mirror arrangement may be used, as is known in the art as such.

The intensity distributions exemplarily illustrated at the bottom of FIG. 25 show the inhomogeneities of the intensity distribution of the illumination ray bundle before and after the mixing unit 950.

Since the ray bundles emerge from the rear end faces of the mixing elements 903 under two opposite angles, it may be envisaged to illuminate the front end faces of the mixing elements 903 under the two opposite angles, too. This further improves the light mixing effect obtained by the mixing unit 950. In order to facilitate the coupling of light into the front end faces of the mixing elements 903, these end faces may have the shape of prisms, as is indicated for the upper most mixing element 903 in FIG. 25 by a dotted line 954.

In another alternative exemplary embodiment a plurality of mixing units (but without the prism 950) are arranged one behind the other in a cascaded fashion so that light emerging from a rear end face of a unit couples into a front end face of a subsequent unit. The prism 950 may be arranged behind the last units of the cascade.

Figure 26:
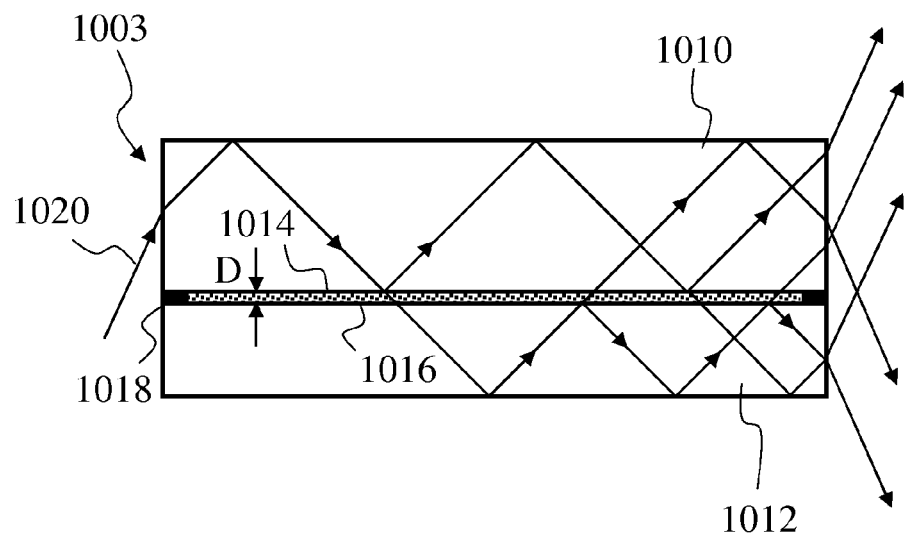
FIG. 26 schematically shows a mixing element according to another embodiment in which two rods are spaced apart by a thin layer of water or another dielectric medium.

FIG. 26 is a schematic cross-section through a light mixing element according to still another exemplary embodiment. Like elements as shown in FIG. 24 are denoted with the same reference numerals increased by 100. The light mixing element 1003 differs from the light mixing element 903 shown in FIG. 24 mainly in that the interspace formed between the first and second surface 1014, 1016 is not filled by air or another gas (mixture), but by a dielectric material, for example highly purified water or a dielectric beam splitting layer including a plurality of individual sub-layers. Then it is not necessary to keep the distance D between the surfaces 1014, 1016 in the order of some tenth or several hundreds of nanometers, or generally at a distance at which frustrated internal reflection occurs. This simplifies the production and mounting of the rods 1010, 1012.

Since the dielectric medium arranged in the interspace between the surfaces 1014, 1016 usually has a higher absorption for the illumination ray bundle than the material of the rods 1010, 1012, the optical losses in the light mixing element 1003 may be somewhat higher than in the exemplary embodiment shown in FIG. 24.

As a matter of course, the light mixing elements 1003 may also be used in a mixing unit 950 as has been shown in FIG. 25.

Figure 27:
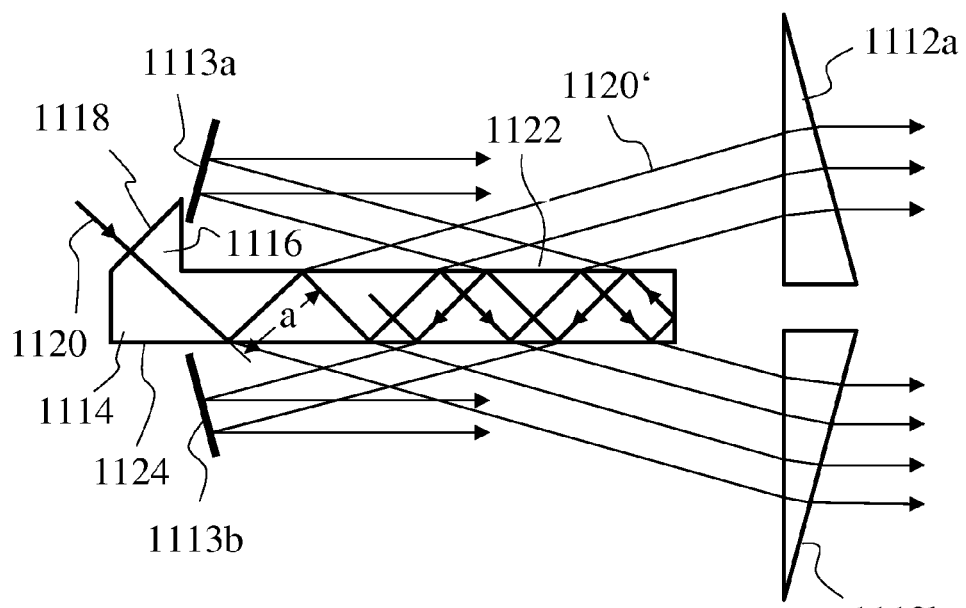
FIG. 27 schematically shows a mixing element according to a still further embodiment including a slab similar to a Lummer-Gehrke plate.

FIG. 27 is a schematic cross-section through a light mixing element 1103 according to a still further exemplary embodiment. The light mixing element 1103 includes a slab 1114 which has (integrally or formed on) a prism portion 1116 with an inclined front end face 1118. If an illumination ray sub-bundle represented by a centroid ray 1120 is coupled into the slab 1114 via its front end face 1118, it will travel to and fro within the slab 1114 due to total internal reflection at its surfaces. However, the angle of incidence of the ray 1120 on the parallel lateral surfaces 1122, 1124 of the slab 1114 is determined such that the angle of incidence is only close to the critical angle. Thus at each reflection at one of the surfaces 1122, 1124 a portion of the ray 1120 is transmitted and emerges from the slab 1114 as refracted ray 1120'. The fraction of light which is transmitted at the surfaces 1122, 1124 is determined by the angle of incidence and the refractive indices of the slab 1114 and the surrounding medium (usually air or another gas). The function of the slab 1114 is therefore similar to the function of a Lummer-Gehrke plate which is used as a spectroscope in the field of optics.

Also in this exemplary embodiment the refracted rays 1120' emerge from the slab 1114 under two different angles. In order to obtain ray bundles running parallel, prisms 1112a, 1112b and mirrors 1113a, 1113b are used.

In contrast to the Lummer-Gehrke plate, it is desirably avoided that the refracted bundles 1120' produce interference patterns in the far field. This can be ensured if the distance a between two reflections within the slab 1114 is in the order of the temporal coherence length of the light. For light having a wavelength of 193 nm and a bandwidth of 1.5 pm, a=2.5 cm. Incidentally, the same condition also applies to the exemplary embodiments shown in FIGS. 24 to 26.

The pupil forming unit according to the disclosure of FIGS. 3, 9 and 10, the optical system according to the disclosure of FIGS. 4 to 8 and 16 to 24, and the optical conditioning unit according to the disclosure of FIGS. 11 to 14 provide a temporal stabilisation of the illumination of the multi-mirror array (MMA) 38 of illumination optics for a projection exposure apparatus for microlithography by the superposition of illumination ray sub-bundles.

These various exemplary embodiments therefore show illumination optics according to the disclosure for a projection exposure apparatus for microlithography for the homogeneous illumination of an object field with object field points in an object plane. The illumination optics have an associated exit pupil for each object field point of the object field. The illumination optics contain at least one multi-mirror array (MMA) having a multiplicity of mirrors for adjusting an intensity distribution in the associated exit pupils of the object field points. The illumination optics have an illumination ray bundle of illumination rays between a light source and the multi-mirror array (MMA). The illumination optics contain at least one optical system for temporally stabilising illumination of the multi-mirror array (MMA), where the temporal stabilisation is carried out by superposition of illumination rays of the illumination ray bundle on the multi-mirror array (MMA).

It is desirable to stabilise the illumination of the multi-mirror array (MMA) in order to decouple this illumination, and therefore the exit pupils of the object field points, of a projection exposure apparatus from the temporal and/or spatial fluctuations of a light source.

By this decoupling, it is possible for the intensity distribution in the exit pupils of object field points, produced by a projection exposure apparatus having the pupil forming unit according to the disclosure of FIGS. 3, 9 and 10, the optical system according to the disclosure of FIGS. 4 to 8 and 16 to 27, and the optical conditioning unit according to the disclosure of FIGS. 11 to 14, to deviate only slightly from a desired intensity distribution in respect of the centroid angle value, the ellipticity and the pole balance.

These exemplary embodiments show a projection exposure according to the disclosure apparatus for microlithography having illumination optics for illuminating an object field with object field points in an object plane, and projection optics for imaging the object field into an image field in the image plane. The illumination optics have, for each object field point of the object field, an associated exit pupil with a greatest marginal angle value $\sin(\gamma)$ of the exit pupil. The illumination optics contain at least one multi-mirror array (MMA) having a multiplicity of mirrors for adjusting an intensity distribution in the associated exit pupils of the object field points. The illumination optics contain at least one optical system for temporally stabilising illumination of the multi-mirror array (MMA) so that, for each object field point, the intensity distribution in the associated exit pupil deviates from a desired intensity distribution in the associated exit pupil:

in the case of a centroid angle value sin(β) by less than two percent expressed in terms of the greatest marginal angle value sin(γ) of the associated exit pupil; and/or in the case of ellipticity by less than two percent; and/or in the case of a pole balance by less than two percent.

By this decoupling it is likewise possible for a first intensity distribution, produced in the exit pupils of object field points by a projection exposure apparatus according to the disclosure, to deviate only slightly in the outer σ or inner σ from a second intensity distribution being produced.

The exemplary embodiments mentioned above therefore likewise show a projection exposure apparatus according to the disclosure for microlithography, having illumination optics for illuminating an object field with object field points in an object plane, having projection optics for imaging the object field into an image field in the image plane, the illumination optics having, for each object field point of the object field, an associated exit pupil with a greatest marginal angle value sin(γ) of the exit pupil, the illumination optics containing at least one multi-mirror array (MMA) having a multiplicity of mirrors for adjusting an intensity distribution in the associated exit pupils of the object field points, the illumination optics containing at least one optical system for temporally stabilising the illumination of the multi-mirror array (MMA), so that for each object field point, a first adjusted intensity distribution in the associated exit plane deviates from a second adjusted intensity distribution in the associated exit pupil by less than the value 0.1 in the outer and/or inner σ.

The multi-mirror array (MMA) 38 according to the disclosure of FIGS. 3 to 12, 14 and 16 to 27 is configured according to the considerations presented above in the introduction to the description, in order to satisfy the properties of a desired resolution in the pupil for a change between annular settings, which differ only slightly in the outer and/or inner σ. Furthermore the multi-mirror array 38 according to the disclosure in the exemplary embodiments of the figures shown inter alia satisfies the properties for the installation space of a projection exposure apparatus and the property of a minimum size of the pupil in the pupil plane 44.

The exemplary embodiments therefore show a multi-mirror array (MMA) for illumination optics for a projection exposure apparatus for microlithography, having an operating light wavelength λ of the projection exposure apparatus in the units [nm], each mirror of the multi-mirror array being rotatable about at least one axis through a maximum tilt angle value sin(α) and having a minimum edge length, the minimum edge length being greater than 200 [mm*nm] *sin(α)/λ.

The optical system according to the disclosure of FIGS. 4 to 8 and 16 to 27 ensures homogenisation of this illumination, extending beyond pure temporal stabilisation of the illumination of the multi-mirror array (MMA) 38, by the superposition of illumination ray sub-bundles on the multi-mirror array. In this case the optical system according to the disclosure in the exemplary embodiments, for the reasons mentioned above in the introduction to the description, introduce only little additional geometrical flux in the form of an increased divergence of the illumination ray sub-bundles after the optical system according to the disclosure.

The exemplary embodiments therefore show an optical system according to the disclosure for homogenising illumination of a multi-mirror array of illumination optics for a projection exposure apparatus for microlithography, having a divergence of the illumination ray bundle and an illumination light direction from the light source to the multi-mirror array (MMA), the divergence of the illumination ray bundle in the illumination light direction after the optical system being less than five times the divergence of the illumination ray bundle before the optical system.

The optical conditioning unit according to the disclosure of FIGS. 11 to 15 is capable of modifying the position, the divergence and/or the ray or bundle profile and/or the polarisation state of the illumination ray bundle 12 between the laser output from a laser 110 and the multi-mirror array (MMA) 38.

The exemplary embodiments therefore show an optical conditioning unit according to the disclosure for conditioning an illumination ray bundle of a laser for illumination optics for a projection exposure apparatus for microlithography, the laser having more than one coherent laser mode and a laser output, and the illumination ray bundle having a divergence, a ray or bundle profile and a polarisation state, the optical conditioning unit modifying at least the divergence and/or the ray or bundle profile and/or the polarisation state of the illumination ray bundle between the laser output and the multi-mirror array (MMA).

The present disclosure is not restricted to the exemplary embodiments noted above.

Such exemplary embodiments as result from a combination of features of individual embodiments which fall within the patent claims, or which are presented in the exemplary embodiments described above, are also considered to be covered by the disclosure.

An example which may be mentioned is the combination of the embodiments according to FIGS. 16 and 17, in which case the integrators 32 and 32a may also be operated in common by sequential arrangement in the light propagation direction. Also to be indicated by way of example are the many combination possibilities of the conditioning unit 400 which was described by way of example in connection with FIGS. 12 to 14, with an integrated 32 or 32a, in which case the two units may be arranged successively in the illumination ray bundle in any desired sequence in the light direction before the multi-mirror array 38.

Furthermore, besides the embodiments which result from combining features of individual embodiments described above, embodiments according to the disclosure which are likewise considered to be covered by the disclosure may also be obtained by interchanging features from different embodiments.

What is claimed is:

1. An apparatus, comprising:

illumination optics configured to illuminate object field points of an object field in an object plane; and projection optics configured to image the object field of the illumination optics on an image field in an image plane, wherein:

the illumination optics have, for each object field point of the object field, an exit pupil associated with the object point, wherein sin(γ) is a greatest marginal angle value of the exit pupil;

the illumination optics comprise a multi-mirror array comprising a plurality of mirrors configured to adjust an intensity distribution in exit pupils associated to the object field points;

the illumination optics comprise an optical system configured to temporally stabilise the illumination of the multi-mirror array so that, for each object field point, a first adjusted intensity distribution in the associated exit pupil deviates from a second adjusted intensity distribution in the associated exit pupil by less than 0.1 in at least one parameter selected from the group consisting of an inner σ and an outer σ;

during use, an illumination ray bundle of illumination rays traverses between a light source and the multi-mirror array, the optical system is configured to temporal stabilise the illumination of the multi-mirror array by superposing the illumination rays of the illumination ray bundle on the multi-mirror array, the optical system is configured for spatially homogeneous illumination of the multi-mirror array, and the apparatus is a projection exposure apparatus configured to be used in microlithography.

2. The apparatus of claim 1, wherein the apparatus has an operating light wavelength λ in units [nm], each mirror of the multi-mirror array is rotatable about at least one axis through a maximum tilt angle value $\sin(\alpha)$, and each mirror of the multi-mirror array has a minimum edge length which is greater than 200 [mm*nm]*$\sin(\alpha)$/λ.

3. The apparatus of claim 2, wherein the object field has an illuminated object field surface having a size OF, and an illuminated surface of the multi-mirror array has a size AF, where AF=c*$\sin(\gamma')$/$\sin(\alpha)$*OF, c is a constant with 0.1<c<1, and $\sin(\gamma')$ is the greatest marginal angle value among the greatest marginal angle values $\sin(\gamma)$ associated with the exit pupils of the object field points.

4. The apparatus of claim 1, wherein an average reflectivity of the mirrors of the multi-mirror array for an angle of incidence between 0° and 60° is more than 25%.

5. The apparatus of claim 4, wherein a standard deviation of the reflectivity of the mirrors of the multi-mirror array from the average reflectivity is, for an angle of incidence between 0° and 60°, less than 50% expressed in terms of the average reflectivity.

6. The apparatus of claim 1, wherein the apparatus is configured for being operated as a scanner, and the intensity distribution of the exit pupils of the object field points are modified during the scan process.

7. The apparatus of claim 1, wherein an illuminated solid angle range in the exit pupil associated with an object field point, which range is generated by a mirror of the multi-mirror array, has a maximum angle range value which is less than 5% expressed in terms of the greatest marginal angle value $\sin(\gamma)$ of the associated exit pupil.

8. The apparatus of claim 1, wherein a solid angle range in the exit pupil associated with an object field point is illuminated with a non-zero intensity and an angle range value of less than 10% expressed in terms of the greatest marginal angle value of the associated exit pupil by at least two mirrors of the multi-mirror array.

9. The apparatus of claim 1, wherein the greatest marginal angle value $\sin(\gamma)$ of the exit pupil associated with an object field point is greater than 0.2 for all object field points.

10. The apparatus of claim 1, wherein the illumination ray bundle has a divergence and an illumination light direction from the light source to the multi-mirror array, and the divergence of the illumination ray bundle in the illumination light direction after the optical system is less than twice the divergence of the illumination ray bundle before the optical system.

11. The apparatus of claim 1, wherein the optical system has a telescopic beam path which is folded by at least one prism or a mirror.

12. The apparatus of claim 1, wherein the optical system is configured to produce an incoherent superposition of the illumination rays of the illumination ray bundle on the multi-mirror array.

13. The apparatus of claim 12, wherein the optical system is configured to produce a temporal modification of the incoherent superposition.

14. The apparatus of claim 12, wherein the optical system is between a light source and the multi-mirror array, wherein an illumination ray of the illumination ray bundle has a height with respect to an optical axis in a plane between the light source and the multi-mirror array perpendicularly to the optical axis, and the optical system comprises an optical phase element configured to introduce a phase lag of the illumination ray as a function of the height of the illumination ray with respect to the optical axis.

15. The apparatus of claim 14, wherein the optical system comprises a honeycomb condenser having a first honeycomb channel plate and a second honeycomb channel plate arranged in a focal plane of the first honeycomb channel plate, and the optical phase element is arranged between the first and the second honeycomb channel plate.

16. The apparatus of claim 15, wherein the honeycomb condenser has a focal length of more than 5 m.

17. The apparatus of claim 14, wherein the optical phase element modifies a phase of the illumination ray bundle in a spatially periodic manner.

18. The apparatus of claim 1, wherein, during use, the apparatus has illumination rays of an illumination ray bundle between a light source and the multi-mirror array, the mirrors of the multi-mirror array have mirror surfaces, and the optical system comprises at least one optical device configured to concentrate illumination rays of the illumination ray bundle on the mirror surfaces of the mirrors of the multi-mirror array.

19. The apparatus of claim 1, further comprising a laser configured to generate an illumination ray bundle, wherein:

the laser has more than one coherent laser mode and a laser output;

the illumination ray bundle has a divergence, a ray or bundle profile and a polarisation state;

the optical system comprises an optical conditioning unit configured to modify at least one parameter selected from the group consisting of the divergence of the illumination ray bundle between the output of the laser and the multi-mirror array, the ray profile of the illumination ray bundle between the output of the laser and the multi-mirror array, and the polarisation state of the illumination ray bundle between the output of the laser and the multi-mirror array.

20. The apparatus of claim 1, wherein at least one mirror of the multi-mirror array has a different surface content than another mirror of the multi-mirror array.

21. The apparatus of claim 1, wherein at least one mirror of the multi-mirror array has a different shortest distance from its closest neighbouring mirror than another mirror of the multi-mirror array.

22. The apparatus of claim 1, wherein the illumination optics comprise at least two multi-mirror arrays, the at least two multi-mirror arrays differing from each other in at least one property of a mirror.

23. The apparatus of claim 1, wherein the optical system comprises:
- a mirror having a mirror surface; and
- an actuator configured to produce a tilt of at least a portion of the mirror surface.

24. An apparatus, comprising:
- illumination optics configured to illuminate object field points of an object field in an object plane, the illumination optics comprising:
  - a multi-mirror array comprising a plurality of mirrors;
  - at least one optical system configured to temporally stabilise the illumination of the multi-mirror array, the at least one optical system comprising:
    - a honeycomb condenser having a first honeycomb channel plate and a second honeycomb channel plate arranged in a focal plane of the first honeycomb channel plate, and an optical phase element arranged between the first and the second honeycomb channel plates; and
- projection optics configured to image the object field of the illumination optics on an image field in an image plane, wherein:
- the illumination optics have, for each object field point of the object field, an exit pupil associated with the object point, wherein $\sin(\gamma)$ is a greatest marginal angle value of the exit pupil;
- the multi-mirror array is configured to adjust an intensity distribution in exit pupils associated to the object field points;
- the illumination of the multi-mirror array is configured to be stabilised so that so that, for each object field point, a first adjusted intensity distribution in the associated exit pupil deviates from a second adjusted intensity distribution in the associated exit pupil by less than 0.1 in at least one parameter selected from the group consisting of an inner $\sigma$ and an outer $\sigma$; and
- the apparatus is a projection exposure apparatus configured to be used in microlithography.

\* \* \* \* \*

UNITED STATES PATENT AND TRADEMARK OFFICE
CERTIFICATE OF CORRECTION

PATENT NO. : 8,724,086 B2  
APPLICATION NO. : 12/818844  
DATED : May 13, 2014  
INVENTOR(S) : Michael Layh et al.

It is certified that error appears in the above-identified patent and that said Letters Patent is hereby corrected as shown below:

In the Specification

Col. 27, line 22, delete "oscillations." and insert -- oscillations, --.

In the Claims

Col. 36, line 12, Claim 24, delete "so that so that," and insert -- so that, --.

Signed and Sealed this  
Twelfth Day of May, 2015

Michelle K. Lee  
*Director of the United States Patent and Trademark Office*